(12) United States Patent
Rea et al.

(10) Patent No.: US 7,937,605 B2
(45) Date of Patent: *May 3, 2011

(54) METHOD OF DESKEWING A DIFFERENTIAL SIGNAL AND A SYSTEM AND CIRCUIT THEREFOR

(75) Inventors: Judith Ann Rea, Rochestown (IE);
Aidan Gerard Keady, Celbridge (IE);
John Anthony Keane, Douglas (IE);
John Martin Horan, Blackrock (IE)

(73) Assignee: Redmere Technology Ltd., Balbriggan, Co. Dublin (IE)

(*) Notice: Subject to any disclaimer, the term of this patent is extended or adjusted under 35 U.S.C. 154(b) by 759 days.

This patent is subject to a terminal disclaimer.

(21) Appl. No.: 11/623,070

(22) Filed: Jan. 13, 2007

(65) Prior Publication Data
US 2007/0164802 A1 Jul. 19, 2007

Related U.S. Application Data

(60) Provisional application No. 60/759,985, filed on Jan. 19, 2006.

(51) Int. Cl.
*H03K 5/01* (2006.01)

(52) U.S. Cl. ........ 713/503; 713/400; 713/401; 713/500; 713/501; 713/502; 713/600; 713/601; 327/100; 327/179; 327/266; 375/316

(58) Field of Classification Search .......... 713/400–401, 713/500–503, 600–601; 327/100, 179, 266; 375/316
See application file for complete search history.

(56) References Cited

U.S. PATENT DOCUMENTS

| | | | |
|---|---|---|---|
| 5,739,713 | A | 4/1998 | Sharpe-Geisler |
| 6,268,753 | B1 | 7/2001 | Sandusky |
| 6,525,568 | B2 | 2/2003 | Ravatin |
| 6,819,166 | B1 | 11/2004 | Choi |
| 7,042,862 | B1 | 5/2006 | Hirade |
| 7,489,739 | B2 | 2/2009 | Dally |
| 7,656,939 | B2 | 2/2010 | Gondi et al. |
| 2002/0030522 | A1 | 3/2002 | Nakamura |
| 2002/0171567 | A1 | 11/2002 | Altare et al. |
| 2002/0175846 | A1 | 11/2002 | Sakimura |
| 2004/0027993 | A1 | 2/2004 | Ghiasi et al. |

(Continued)

FOREIGN PATENT DOCUMENTS

EP 1 580 947 9/2005

(Continued)

OTHER PUBLICATIONS

Afshin Rezayee and Ken Martin "A 10 Gb/s Clock Recovery Circuit with Linear Phase Detector . . . " European Solid State Circuits Conference (SSCIRC) Florence, Italy, 2002, p. 419.

(Continued)

*Primary Examiner* — Abdelmoniem Elamin

(57) ABSTRACT

A high-definition multimedia interface (HDMI) receiver recovers high speed encoded data which are transmitted differentially over data channels of a lossy cable, along with a clock. Inter symbol interference, high-frequency loss, skew between the clock and data channels, and differential skew within a differential signal are compensated by analog circuits which are automatically tuned for best performance by observing the quality of the recovered analog signal. Oversampling is used to provide a 24-bit digital representation of the analog signal for determining the quality of the signal. A corresponding method of deskewing a differential signal and a system and circuit therefor are also provided.

21 Claims, 21 Drawing Sheets

U.S. PATENT DOCUMENTS

| | | |
|---|---|---|
| 2004/0028065 A1 | 2/2004 | Schoch et al. |
| 2004/0131058 A1 | 7/2004 | Ghiasi |
| 2004/0222829 A1 | 11/2004 | Cho et al. |
| 2005/0069032 A1 | 3/2005 | Hirata |
| 2005/0083130 A1 | 4/2005 | Grilo |
| 2007/0268407 A1 * | 11/2007 | Rea et al. ............. 348/572 |
| 2009/0290671 A1 * | 11/2009 | Rea et al. ............. 375/371 |

FOREIGN PATENT DOCUMENTS

| | | |
|---|---|---|
| WO | WO 99/55000 | 10/1999 |

OTHER PUBLICATIONS

High-Definition Multimedia Interface, Specification version 1.2 dated Aug. 22, 2005.

* cited by examiner

METHOD OF DESKEWING A DIFFERENTIAL SIGNAL AND A SYSTEM AND CIRCUIT THEREFOR

RELATED APPLICATIONS

The present patent application claims priority from the U.S. provisional patent application Ser. No. 60/759,985 to Judith REA et al. entitled "AN IMPROVED DATA RECOVERY SYSTEM FOR SOURCE SYNCHRONOUS DATA CHANNELS" filed on Jan. 19, 2006. The present patent application is related to the US patent application to Judith REA et al. entitled "A METHOD OF DESKEWING A DIFFERENTIAL SIGNAL AND A SYSTEM AND CIRCUIT THEREFOR" filed concurrently herewith and incorporated herein by reference.

FIELD OF THE INVENTION

The present invention relates to data recovery systems, and in particular, to an improved data recovery system for source synchronous data channels.

BACKGROUND OF THE INVENTION

The distribution of television signals has increasingly become based on digital methods and digitally encoded forms of video and audio signals. At the same time, higher resolution (high definition TV) has become available in the market place, commensurate with larger and higher definition displays. To meet the requirement of interconnecting such high definition displays with digital signal sources such as Digital Versatile Disc (DVD) players and receivers/decoders for digital satellite and digital cable distribution of video material, a digital interface standard has evolved, known as the High-Definition Multimedia Interface (HDMI). A detailed specification for HDMI can be obtained from the "hdmi.org" website. The HDMI specification currently available and used in this application is HDMI specification version 1.2 dated Aug. 22, 2005, which is incorporated herein by reference. This HDMI standard can be employed for connecting digital video sources to digital video sinks over a cable that carries a number of digital signals and a clock signal.

This interface, being capable of running at a very high data rate presents a number of challenges that need to be solved, in order that cost-effective hardware implementations can be manufactured for the consumer market.

Existing technologies commonly used in high performance telecommunications equipment could be employed to build HDMI receivers and transmitters, but would scarcely meet the cost, power, and size targets implied by the consumer market.

Consequently there is a need for the development of innovative techniques to enable a data recovery system for a low-cost, low-power HDMI receiver.

SUMMARY OF THE INVENTION

There is an object of the invention to provide an improved data recovery system for a HDMI receiver.

According to one aspect of the invention, there is provided a data recovery system for processing a high speed differential data signal and a clock signal into a digital signal, comprising:

analog front end (AFE) circuitry having adjustable parameters for processing the differential data signal into a preprocessed data signal having reduced distortion;

an oversampling circuit providing a digital representation of the preprocessed data signal;

a training function circuit for estimating a quality of the digital representation of the preprocessed data signal, and adjusting the parameters of the AFE circuitry to improve the quality of the digital representation of the preprocessed data signal; and a bit extractor circuit for generating the digital signal from the digital representation of the preprocessed data signal.

The AFE circuitry of the data recovery system includes an analog differential deskew circuit for adjusting an existing time skew of two polarities of a differential data signal to generate a deskewed signal. The AFE circuitry further includes an equalizer circuit for adjusting a frequency response of the deskewed signal to produce an equalized signal, the equalizer beneficially having at least two settings for adjusting the frequency response of the deskewed signal. The AFE circuitry further includes a phase compensator for aligning a phase of the equalized signal and a phase of a clock signal, the phase compensator comprises an analog phase detector generating an analog delay control signal; and a programmable analog delay circuit in the path of the data signal for changing the phase of the equalized signal in response to the analog delay control signal. The analog phase detector of the phase compensator comprises a phase detector for comparing the phase of the equalized signal and the phase of the clock signal; a window generator for detecting positive edges of the equalized signal and generating an enable signal for the phase detector; and a circuit for converting the output of the phase detector into the analog delay control signal.

The analog differential deskew circuit of the AFE circuitry comprises a number of delay units arranged sequentially; an analog selector, selecting a composite delay resulting from the delay units that are selected by the analog selector; and analog switches inserting the composite delay into the polarities of the differential signal. Preferably, the analog switches insert the composite delay into one or the other polarity of the differential signal. Beneficially, each of the analog delay units comprises one or more amplifiers and has a gain, which is substantially equal to 1.0. In the embodiment of the invention, each analog delay unit comprises first and second amplifiers having a common input, which is the input of the analog delay unit, and their outputs being summed to generate the output of the analog delay unit; the first amplifier having a gain of $(1.0-\Delta)$, and a delay equal to a predetermined delay value; and the second amplifier having a gain of $\Delta$, and substantially the same delay as the first amplifier. Preferably, the first amplifier is a follower stage, and the second amplifier has a shunt capacitor for setting the gain of $\Delta$.

A receive interface for a HDMI receiver is also provided, comprising one or more data recovery systems described above, and a clock recovery circuit for generating a bit clock and a multi-phase clock signal from the clock signal, the multi-phase clock signal having at least M phases for each period of the bit clock; the multi-phase clock signal being used for generating the digital representation of the preprocessed data signal by oversampling the preprocessed data signal in each of the data recovery systems.

The training function circuit of the data recovery system comprises a digital circuit for estimating the quality of the preprocessed data signal and generating a Quality Number indicating said quality; an evaluation run control circuit for adjusting the parameters of AFE circuitry to a number of predetermined settings, and for monitoring a predetermined large number of the oversampled bits for each setting; a memory for retaining the best setting corresponding to the highest Quality Number; and a means for updating the parameters of the AFE circuitry to the best setting.

The digital circuit for estimating the quality of the preprocessed signal comprises a length detection circuit for determining the run length of contiguous "1" or "0" samples in the digital representation of the preprocessed data signal within a window of at least one bit period; a plurality of counters for counting the number of occurrences of selected run lengths during an observation period of "N" bits; and a bit quality calculator for processing the outputs of the counters into a Quality Number indicating the quality of the preprocessed data signal.

According to another aspect of the invention, there is provided a method of processing a high speed differential data signal and a clock signal into a digital signal in a data recovery system having an analog front end (AFE) circuitry having adjustable parameters, the method comprising the steps of:

(a) processing the differential data signal into a preprocessed data signal having reduced distortion;
(b) oversampling the preprocessed data signal to produce a digital representation of the preprocessed data signal;
(c) estimating a quality of the digital representation of the preprocessed data signal;
(d) adjusting the parameters of the AFE circuitry to improve the quality of the digital representation of the preprocessed data signal; and
(e) generating the digital signal from the digital representation of the preprocessed data signal.

The step (c) of the above noted method comprises generating a Quality Number indicating the quality of the digital representation of the preprocessed data signal; and the step (d) comprises adjusting the parameters of the AFE circuitry to a number of predetermined settings, and monitoring a predetermined large number of the oversampled bits for each setting.

In the embodiment of the invention, the step (c) of the above noted method comprises determining a run length of contiguous "1" or "0" samples in the digital representation of the preprocessed data signal within a window of at least one bit period; counting the number of occurrences of selected run lengths during an observation period of "N" bits in a plurality of counters; and processing the outputs of the counters into the Quality Number for each setting. The step (d) of the method further comprises retaining the best setting corresponding to the highest Quality Number; and updating the parameters of the AFE circuitry to the best setting.

Thus, an improved data recovery system for a HDMI receiver, and a corresponding method of processing a high speed differential data signal and a clock signal into a digital signal have been provided.

BRIEF DESCRIPTION OF THE DRAWINGS

An embodiment of the invention will now be described, by way of example, with reference to the accompanying drawings in which.

DETAILED DESCRIPTION OF THE EMBODIMENTS OF THE INVENTION

The data recovery system of the embodiment of the present invention is useful in applications where high speed data has been transmitted on one or more serial channels. Conveniently, data is sent along with the clock that is used for the generation of the data timings. The system is particularly effective when the data has been transmitted through a cable of a limited bandwidth, which results in considerable Inter Symbol Interference (ISI) in the data streams. The system is also extended to deal with intra-pair or differential skew in the cabling.

Figure 1:
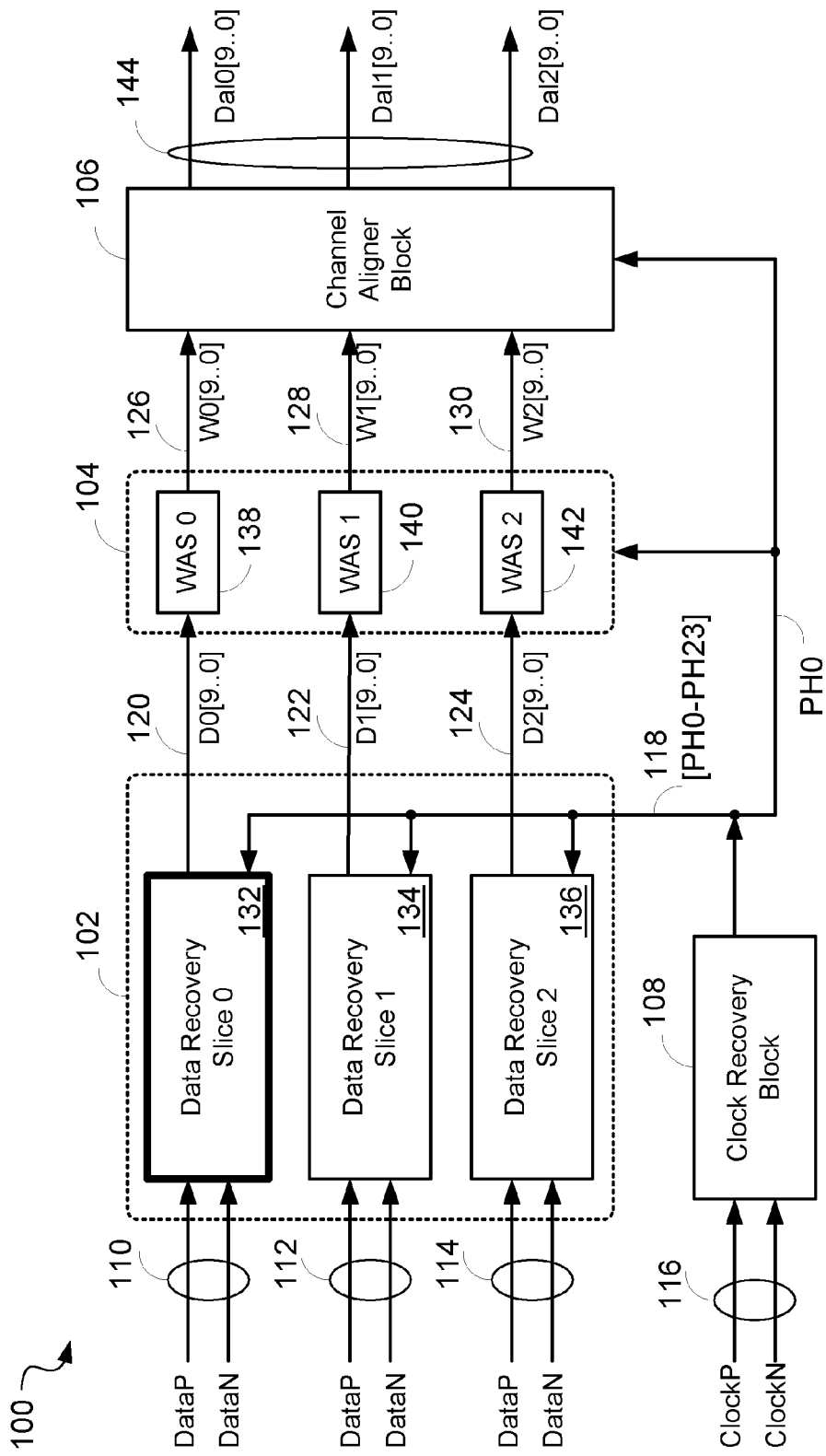
FIG. 1 shows a block diagram of a HDMI receive interface 100 of the embodiment of the invention.

FIG. 1 shows a block diagram of a HDMI receive interface 100 of the embodiment of the present invention. The HDMI receive interface 100 comprises a Data Recovery Block 102; a Word Aligner Block 104; a Channel Aligner Block 106; and a Clock Recovery Block 108. The overall function of the HDMI receive interface 100 is to recover the digital information sent to it from an HDMI source over a cable that includes 4 differential signal pairs.

The inputs to the HDMI receive interface 100 include three differential TMDS (Transition Minimized Differential Signaling) coded data channels 110, 112, and 114, connected to the Data Recovery Block 102, and a TMDS clock channel 116 connected to the Clock Recovery Block 108. The TMDS coding is described in the HDMI specification. As is conventional, each differential channel includes two signals: a positive and a negative signal, labeled DataP and DataN respectively for the data channels, and ClockP and ClockN for the clock channel.

A multiphase clock signal 118 (clock phases PH0 to PH23 of the recovered clock) is connected from the Clock Recovery Block 108 to the Data Recovery Block 102. The clock phase PH0 is also connected to the Word and Channel Aligners 104 and 106.

The Data Recovery Block 102 recovers the bit streams of the three TMDS coded data channels 110, 112, and 114, and generates from them three 10-bit parallel digital signals 120, 122, and 124, labeled D0[9..0], D1[9..0], and D2[9..0] respectively, for inputting to the Word Aligner Block 104. The function of the Word Aligner Block 104 is to align the three 10-bit parallel digital signals (120, 122, 124) into three aligned data words 126, 128, and 130, labeled W0[9..0], W1[9..0], and W2[9..0] respectively, for inputting to the Channel Aligner Block 106.

The Data Recovery Block 102 and the Word Aligner Block 104 are each comprised of three processing slices (Data Recovery Slices 0-2, reference numerals 132, 134, 136, and Word Aligner Slices [WAS] 0-2 reference numerals 138, 140, 142 respectively). Processing of each of the three TMDS coded data channels 110, 112, and 114 into the corresponding three 10-bit parallel digital signals 120, 122, and 124 is performed independently by the respective Data Recovery Slices 132, 134, and 136, each of which also receives the multiphase clock signal 118.

Similarly, the processing of the three 10-bit parallel signals (120, 122, 124) into the three aligned data words 126, 128, and 130 is performed independently by the three respective Word Aligner Slices 138, 140, 142. Because of possibly different propagation delays (in the cable from the signal source, not shown) and processing delays in the Data Recovery Slices 132, 134, 136, and Word Aligner Slices 138, 140, 142, the resulting three aligned data words 126, 128, and 130 may arrive skewed in time with respect to each other. The function of the Channel Aligner Block 106 includes aligning the three received digital channels (the aligned data words 126, 128 and 130) with each other and provide a synchronized stream 144 of three 10-bit digital words to subsequent processing stages (not shown).

The Clock Recovery Block 108 converts the received TMDS clock channel 116 into at least one phase of the recovered clock 118; in the present invention, up to 24 recovered clock phases (PH0 to PH23) are generated for use by the Data Recovery Block 102. The generation of the multiphase clock signal 118 from the TMDS clock channel 116 may be accomplished with a phase locked loop using any of a number of known techniques to generate multiple phases of a clock, and is not described in detail here.

The Word Aligner Block 104, and the Channel Aligner Block 106 are digital processing circuits and may be connected to only one of the recovered clock phases (e.g. PH0). These digital processing circuits are not further described.

The Clock Recovery Block 108 may be implemented as a common phase locked loop (PLL) the details of which are familiar to persons skilled in the art.

The HDMI receive interface 100 shown in FIG. 1 provides an exemplary context within which the present invention of a novel Data Recovery system is embodied. The Data Recovery Slice 132 is representative of the three Data Recovery Slices within the Data Recovery Block 102. The following descriptions provide more detailed information of the Data Recovery Slice 132.

Figure 2:
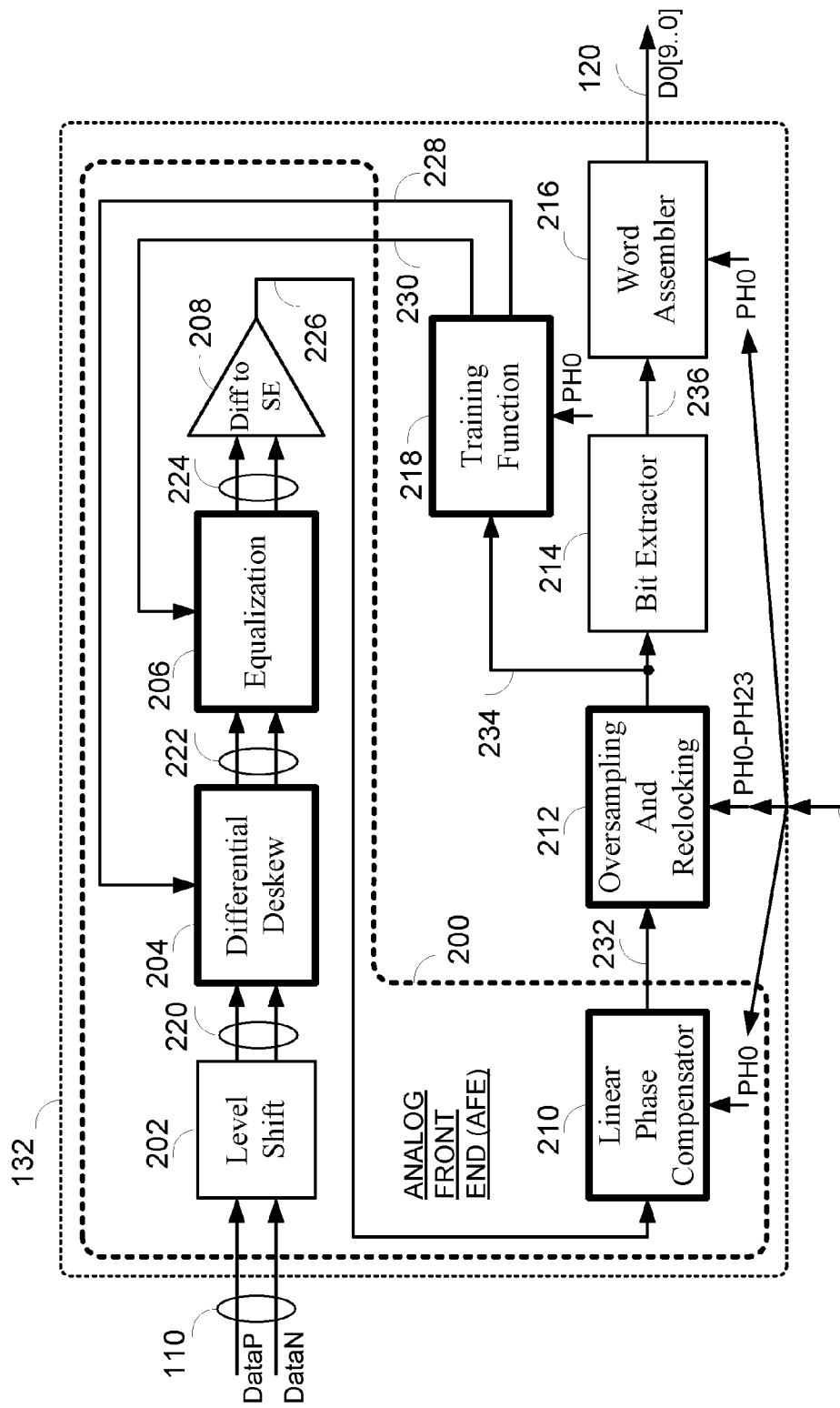
FIG. 2 shows an overview of the Data Recovery Slice 132 of the HDMI receive interface 100 of FIG. 1.

FIG. 2 shows an overview of the Data Recovery Slice 132 of the HDMI receive interface 100, including:
   an Analog Front End (AFE) 200 that comprises the following 5 blocks:
   a Level Shift block 202;
   a Differential Deskew block 204;
   an Equalization Block 206;
   a Differential-to-Single-Ended block 208;
   a Linear Phase Compensator 210;
and
   an Oversampling and Reclocking block 212;
   a Bit Extractor 214;
   a Word Assembler 216; and
   a Training Function block 218.

The TMDS coded data channel 110 comprising the differential signal (denoted "DataP" and "DataN") is an input to the Data Recovery Slice 132, and is connected to the input of the Level Shift block 202. The differential TMDS coded signal was (presumably) generated as a digital signal by a HDMI transmitter but may have suffered various forms of distortion, including inter symbol interference (ISI), delay and frequency distortion before it arrives as effectively an analog signal at the HDMI receiver 100. The first group of blocks (202 to 210), the so-called Analog Front End circuitry or AFE 200, are preprocessing stages that use analog techniques to process the received data signal in order to largely remove ISI and other distortions, and phase align the data signal with the clock before it (a preprocessed data signal) is oversampled in the Oversampling and Reclocking block 212 to be further processed as a digital signal using digital techniques in the subsequent blocks (214 to 218).

The Linear Phase Compensator 210 (having an analog delay line) is also considered to be part of the AFE 200. The single ended signal 226 is "analog" in the sense of timing, not yet having been retimed, even though it is full rail-to-rail, i.e. it has a "digital" amplitude with sharp rise and fall times.

It is worth noting for clarification, that although 24 clock phases are provided, the spacing of the 24 clock phases is $\frac{1}{12}$th of a data bit period. The 24 clock phases thus effectively cover a period of two data bits without however any presumption of clock/data alignment which will be a function of the Linear Phase Compensator 210 to be described below.

As also shown in FIG. 1, the multiphase clock signal 118 (comprising phases PH0 to PH23) provides clocks for the Data Recovery Slice 132, specifically a clock reference (PH0) to the Linear Phase Compensator 210, a clocking signal (PH0) to the Word Assembler 216. All 24 phases of the multiphase clock signal 118 (PH0 to PH23) are connected to the Oversampling and Reclocking block 212.

The Level Shift block 202 generates a level shifted differential signal 220 that is input to the Differential Deskew block 204 whose output is a differential deskewed signal 222. The differential deskewed signal 222 is then processed by the Equalization Block 206 whose output (an equalized signal 224) is connected to the Differential-to-Single-Ended block 208 which converts the equalized signal 224 that is differential into a single-ended signal 226.

Both the Differential Deskew block 204 and the Equalization Block 206 receive control signals (deskew parameters 228 and equalization parameters 230 respectively) from the Training Function 218.

The Linear Phase Compensator 210 receives as inputs the single-ended signal 226 and the PH0 phase of the multiphase clock signal 118, and produces as output a phase aligned signal 232 (the preprocessed data signal).

The Oversampling and Reclocking block 212 receives the phase aligned signal 232 as well as all 24 phases of the multiphase clock signal 118, to generate a 24-sample digital samples signal 234 which is then connected to both the Bit Extractor 214 and the Training Function block 218. The output of the Bit Extractor 214 is a single-bit signal 236 representing the processed and recovered TMDS coded digital bit stream, to be assembled into 10-bit words in accordance with the HDMI specification in the Word Assembler 216 that generates the 10-bit parallel digital signal 120 (D0[9..0]) which is the output of the Data Recovery Slice 132.

The Training Function block 218 also receives the 24-sample digital samples signal 234 which, as will be described below, is used by this block to determine the deskew parameters 228 and the equalization parameters 230, that are then fed back to the Differential Deskew and Equalization Blocks (204 and 206) respectively.

Both the Word Assembler 216 and the Training Function block 218 also use one of the clock phases (PH0) of the multiphase clock signal 118.

The differential data (DataP and DataN) coming from the cable are immediately passed through an analog preprocessing section (the blocks 202 to 210, i.e. the analog front end or AFE 200). One purpose of the AFE 200 is to remove a large amount of the Inter-Symbol Interference (ISI) and other distortion in the data stream. The Differential Deskew block 204 and the Equalization Block 206 will be described in more detail below. The data emerging from this section (the preprocessed data signal 232) is a single ended rail to rail signal with some residual ISI, and whose phase has been aligned to a clean on-board clock (the phase PH0 of the multiphase clock signal 118, derived from the clock which is transmitted with the data, i.e. the TMDS clock channel 116, FIG. 1). The phase alignment is done by the Linear Phase Compensator 210, which does not use over-sampling of the data for phase detection (oversampling of the already aligned signal only occurs in the next stage, for a different purpose, see below). Rather, the Linear Phase Compensator 210 detects transitions in the data signal (the single-ended signal 226) and uses an analog phase detector and a delay circuit to align the data with the clock (the phase PH0 of the multi phase clock signal 118), as will be described in more detail below. This block outputs the preprocessed data signal (the phase aligned signal 232) that is aligned to the onboard clock (PH0), and is followed by the Oversampling and Reclocking block 212 that uses multiple phases of the clock (PH0 to PH23 of the multiphase clock signal 118) to create a digital representation of the preprocessed data signal in the form of multiple samples of the received wave form. The sampled data (24-sample digital samples signal 234) is then fed to the Bit Extractor 214 and the Word Assembler 216 to extract the data bits and to combine words of data (the 10-bit parallel digital signal 120) that are synchronized with a slower word clock (CLKWord, not shown).

Analog Front End (AFE) Circuitry 200

The differential signal (the TMDS coded data channel 110) coming from the cable may contain significant Inter symbol interference (ISI) and other distortion. The differential signal may also be warped, that is the two signal components (DataP and DataN) are skewed in time with respect to each other (differential skew), further distorting the received signal. The Differential Deskew block 204 and the Equalization block 206 process the differential signal, treating it as an analog signal, in order to compensate the differential skew and the ISI. The Linear Phase Compensator 210 aligns the data signal with the on-board clock PH0, to provide the preprocessed data signal 232 to the next stage (the Oversampling and Reclocking block 212).

Figure 3:
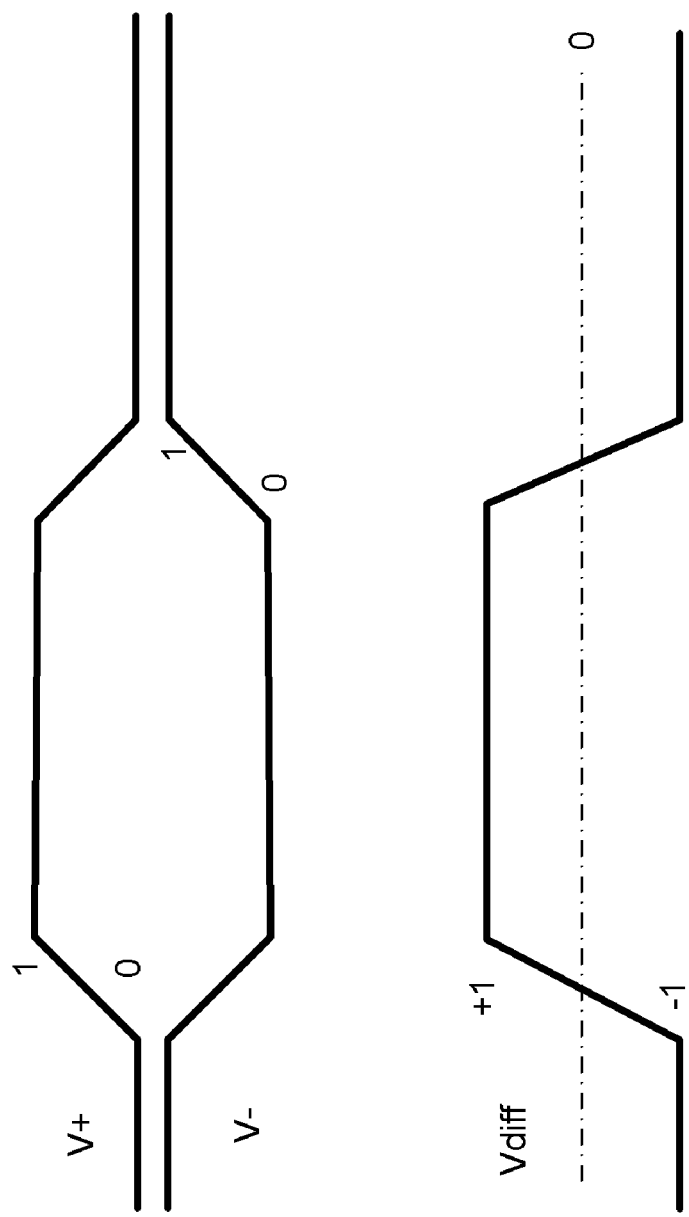
FIGS. 3a and 3b show timing diagrams of the single ended signal components and the corresponding differential signal of the differential data on a HDMI channel respectively as they might be transmitted by an HDMI transmitter.
Figure 4:
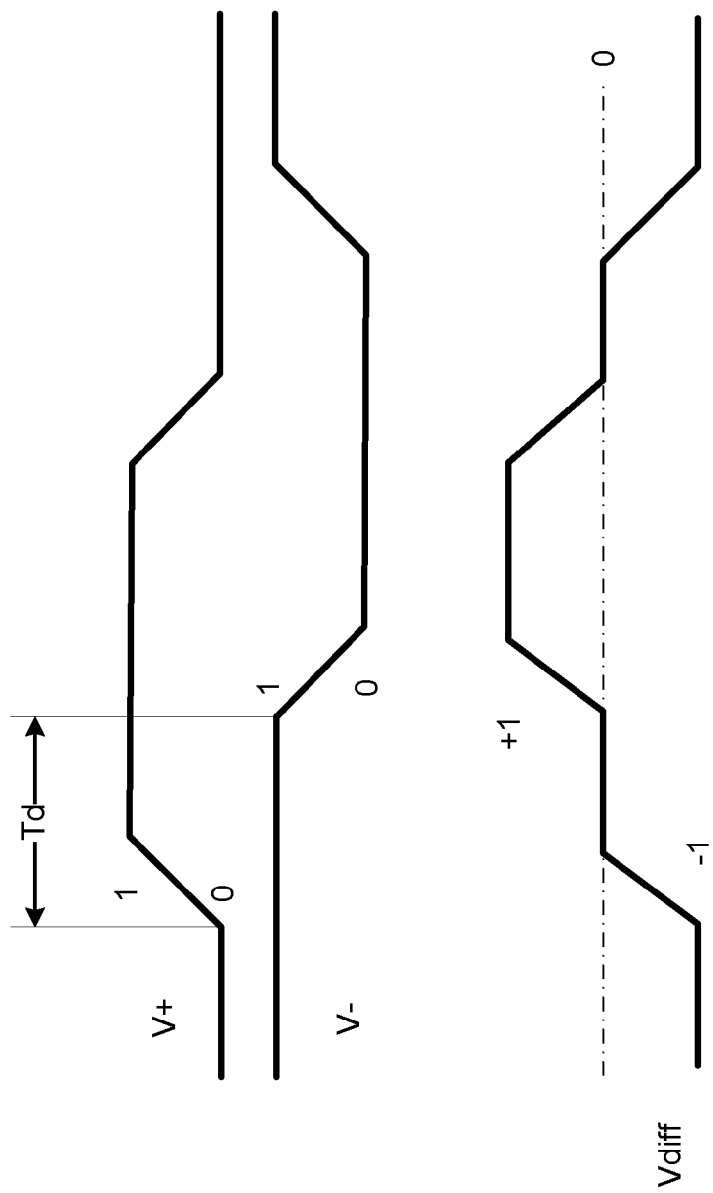
FIGS. 4a and 4b show example timing diagrams of the single ended signal components and the corresponding differential signal of the differential data as they might be received by an HDMI receiver from the cable.

The impact of differential skew is depicted in timing diagrams in FIGS. 3 and 4.

FIG. 3a shows a timing diagram of the two single ended signal components (V+, V−) of the differential data on a HDMI channel, as it would be transmitted by an HDMI source into the cable. A timing diagram of the corresponding differential signal (Vdiff) is shown in FIG. 3b. The differential signal is clean and easily interpreted.

FIG. 4a shows an example timing diagram of the two single ended signal components (V+ and V−) of the differential data on a HDMI channel, as it might be received by an HDMI receiver from the cable. FIG. 4b shows a timing diagram of the corresponding differential signal (Vdiff). The signals V+ and V− are skewed in time with respect to each other. The negative signal component V− is delayed with respect to the signal component V+ by a differential skew delay of Td. As a consequence, the differential signal (Vdiff in FIG. 4b) is significantly distorted with clearly visible plateaus in the signal where the differential signal is zero (0). These plateaus regions can only be interpreted as noise by the receiver, the result of which is to reduce the width of the window of valid data. This reduction is seen as closure of the receive data eye and directly compromises the channel quality. The amount of differential skew delay (Td) primarily depends on the cable characteristics and may include a small amount of differential circuit delays, but is basically constant or varies only slightly, slowly with time.

The differential skew delay may be compensated by inserting a delay element having a delay of Td in the path of V+ (in the case of the example of FIG. 4), or in the path of V− in the opposite case (where the input V+ signal was delayed with respect to V−), or neither if there was no skew present.

Differential Deskewing 204

Figure 5:
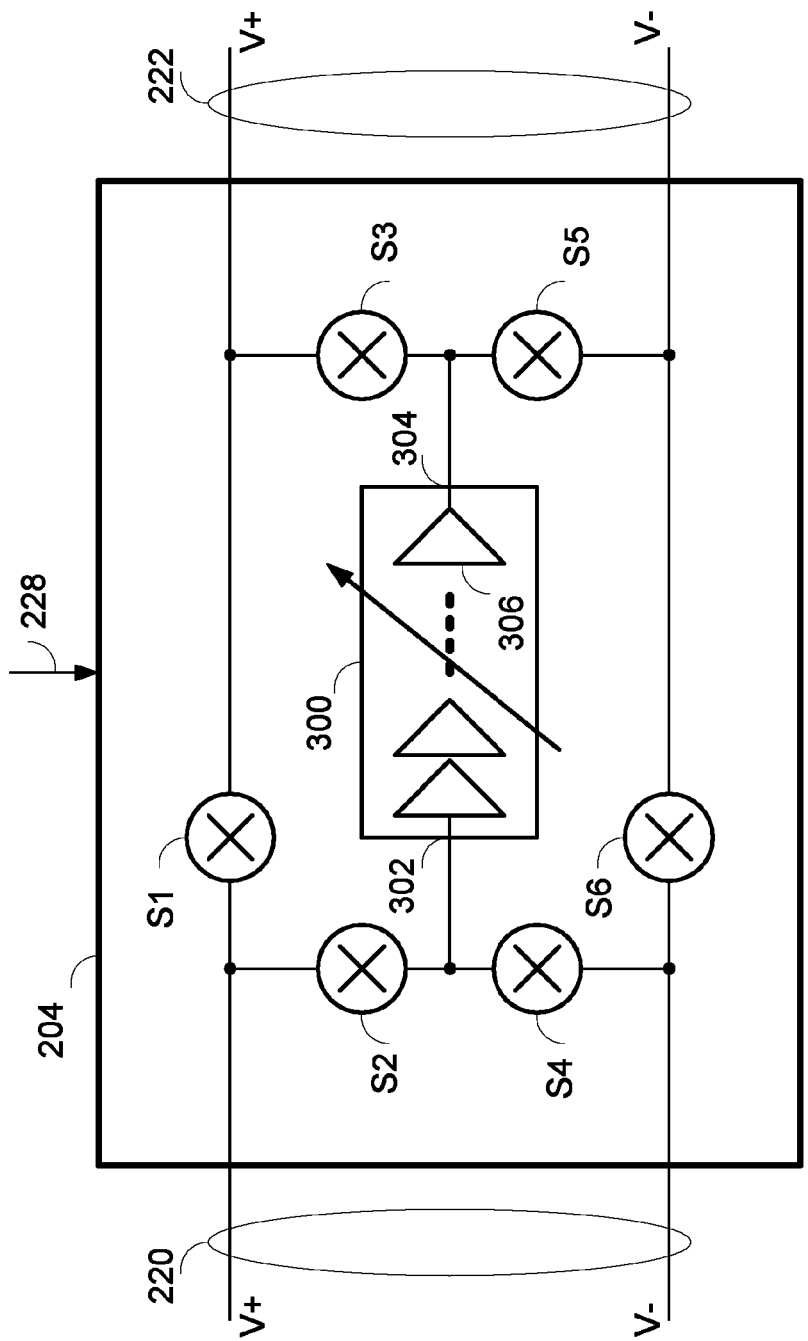
FIG. 5 a simplified block diagram of the Differential Deskew block 204 of the Data Recovery Slice 132 of FIG. 2.

In the embodiments of the present invention, the differential skew is removed (compensated) by the Differential Deskew block 204 (FIG. 2), a simplified block diagram of which is shown in FIG. 5, using the same reference numerals to indicate the differential inputs (220 and 222 respectively, each with a positive [V+] and a negative [V−] terminal), and the control input for the deskew parameters (228).

The Differential Deskew block 204 shown in FIG. 5 includes a variable (adjustable) delay 300 with a (single ended) input 302 and an output 304, and six ON/OFF switches S1 to S6. The variable delay 300 includes a number of delay stages 306. The switch S1 is connected between the positive terminal of the differential input (220 V+) and the positive terminal of the differential output (222 V+). Similarly, the switch S6 is connected between the negative terminal of the differential input (220 V−) and the negative terminal of the differential output (222 V−). The switches S2 and S4 are connected between the input 302 of the adjustable delay 300 and the positive (V+) and negative (V−) terminals respectively of the input 220. Similarly, the switches S3 and S5 are connected between the output 304 of the adjustable delay 300 and the positive (V+) and negative (V−) terminals respectively of the output 222.

The scheme allows the single variable delay 300 to correct for both positive and negative differential skew. In effect, the single variable delay 300 is sufficient to compensate positive or negative differential skew (where either the positive signal or the negative signal is delayed with respect to the other), by switching it (the adjustable delay 300) into either the negative or the positive signal path respectively. For example, to pass the positive V+ through the adjustable delay 300 (which is made of a cascade of delay units, to be described in detail below) the switch states are as follows: S1=OFF, S2=ON, S3=ON, S4=OFF, S5=OFF, and S6=ON. To pass V− through the adjustable delay 300 the switch states are as follows: S1=ON, S2=OFF, S3=OFF, S4=ON, S5=ON, S6=OFF. To switch the variable delay 300 out of both the V− and the V+ paths, thus providing no adjustment of the differential delay, the switch states are as follows: S1=ON, S2=OFF, S3=OFF, S4=OFF, S5=OFF, S6=ON.

It is contemplated that instead of inserting the composite delay into one the other polarities of the differential signal, it is possible to insert the composite delay into the two polarities of the differential signal.

There are two challenges to solve the deskew problem. The first is to make a suitable delay, the second is to tune the delay. Making the delay is a challenge, because the unit should have a wide enough bandwidth to pass the signals, but at the same time the block has to produce a useful delay. The wide bandwidth of a single delay stage naturally results in little delay, so a cascade of stages is required to achieve a sufficient delay.

A cascade of digital delay stages, including digital switches and a decoder to provide binary addressable selection of the overall delay, are described in U.S. Pat. No. 6,268,753. However, the present invention requires an adjustable delay circuit to delay a high speed analog signal.

Issues to be solved with a cascade of analog delay stages in the proposed configuration of FIG. 5 for differential skew compensation, include the need to provide unity gain, as well as preserve the high bandwidth required.

Among the prior art, several digital delay compensation schemes are disclosed, but only few circuits provide an adjustable delay for analog signals. For example, the use of a follower circuit in parallel with a gain stage to boost the high frequency response of a digital circuit is taught in U.S. Pat. No. 5,739,713. U.S. Pat. No. 6,525,568 teaches a phase shifting (delay) stage that includes an RC (resistor-capacitor) element followed by parallel gain stages of nominally −1 and +2 gain, their outputs added together to provide overall unity gain with a particular complex frequency transfer function. In the United States Patent Application 20050083130 a high performance amplifier is proposed which includes a delay element to compensate for signal propagation delay that may exist in alternative signal paths.

Figure 6:
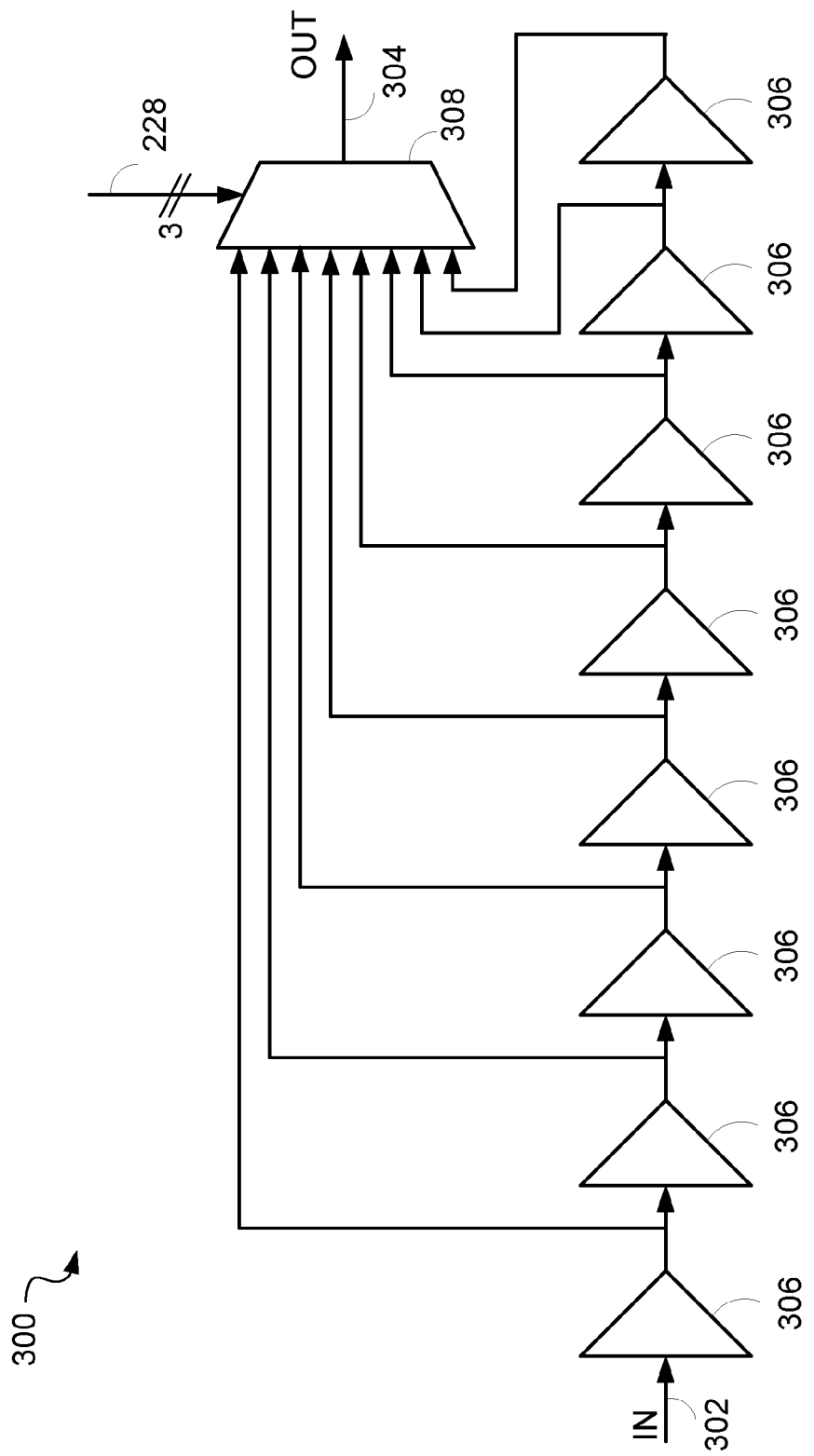
FIG. 6 shows the preferred embodiment of the adjustable delay block 300 of the Differential Deskew block 204 of FIG. 5.

The preferred embodiment of the variable delay block 300 of FIG. 5, is shown in FIG. 6, as a cascade of eight analog delay stages ("Delay Units") 306 in combination with an analog selector stage 308 is used to implement the adjustable delay 300. The eight delay units 306 are connected in series (cascaded), the output of each delay unit 306 being input to the analog selector stage 308. The first delay unit 306 of the cascade provides the input of the variable delay 300 (IN 302).

The deskew parameters control signal (228) includes a 3-bit binary signal connected to the analog selector stage 308 for selecting one of its inputs to be switched through to the output of the adjustable delay 300 (OUT 304).

Figure 16:
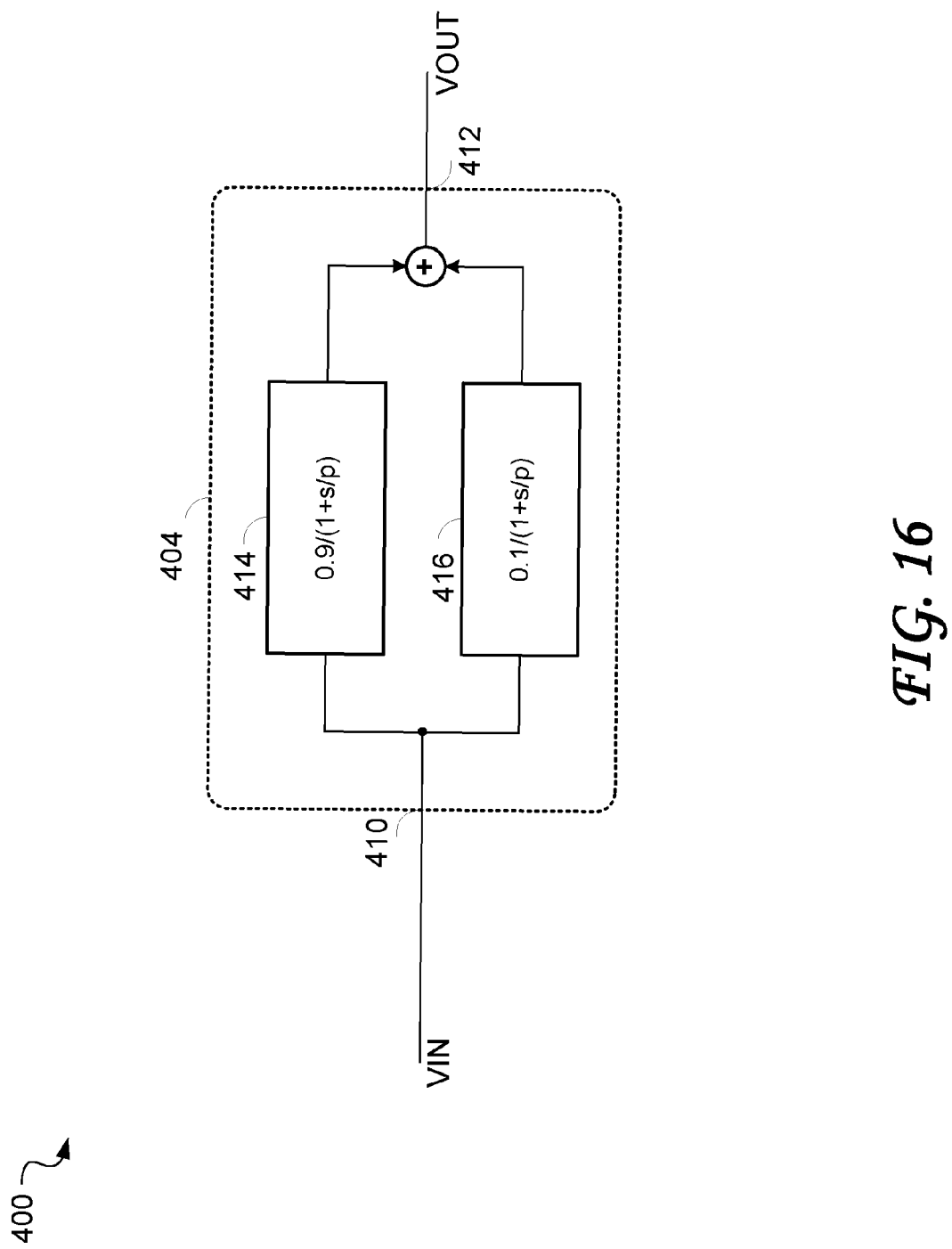
FIG. 16 shows a simplified block diagram of a buffered delay stage 400 as an implementation of the delay unit 306 of the adjustable delay 300 of FIG. 6.

An exemplary complete circuit of the single delay unit 306 which may be cascaded to provide a unit of delay each, for the adjustable delay 300 is shown in FIG. 16 below.

To help in understanding the circuitry of the single delay unit 306, a step by step description of the issues to be solved, and possible solutions, is presented first.

Figure 7:
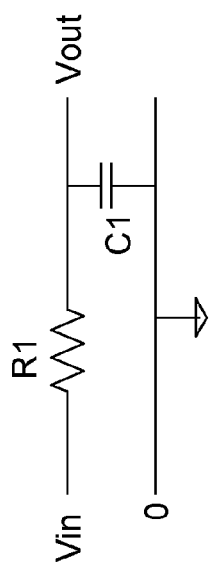
FIG. 7 shows a simple RC delay circuit.
Figure 8:
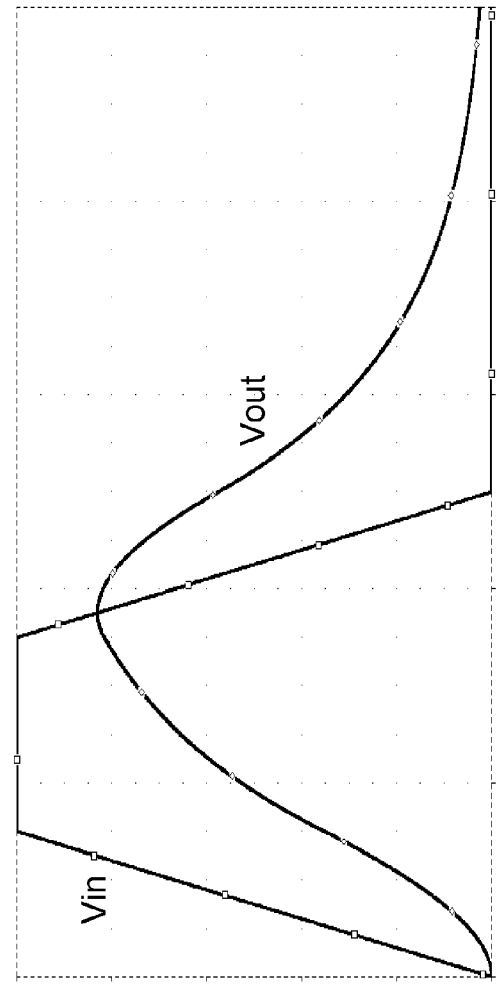
FIG. 8 shows simulation results of the RC circuit of FIG. 7.

To introduce the delay (Td) a simple RC delay circuit as shown in FIG. 7 may be used. The circuit of FIG. 7 is a single ended circuit comprising a resistor R1, a capacitor C1, and input and output terminals (signals Vin and Vout), as well as a ground (0). The capacitor C1 is connected between Vout and ground, and the resistor is connected between Vin and Vout. Making a circuit with an RC delay as shown in FIG. 7 will succeed in delaying the signal but it will also filter the signal. The impact of the RC circuit of FIG. 7 on a pulse is seen from simulation results shown in FIG. 8. FIG. 8 shows two simulated wave forms, a trapezoid input pulse Vin, and an output pulse (Vout), that results from passing the trapezoid input pulse through the simple RC delay circuit of FIG. 7. The trapezoid input pulse (the signal Vin) is delayed and filtered (distorted) into the output signal Vout. The delay and the filtering action are clearly seen. While the delay is desirable, the filtering action causes dispersion and distortion of the pulse.

Figure 9:
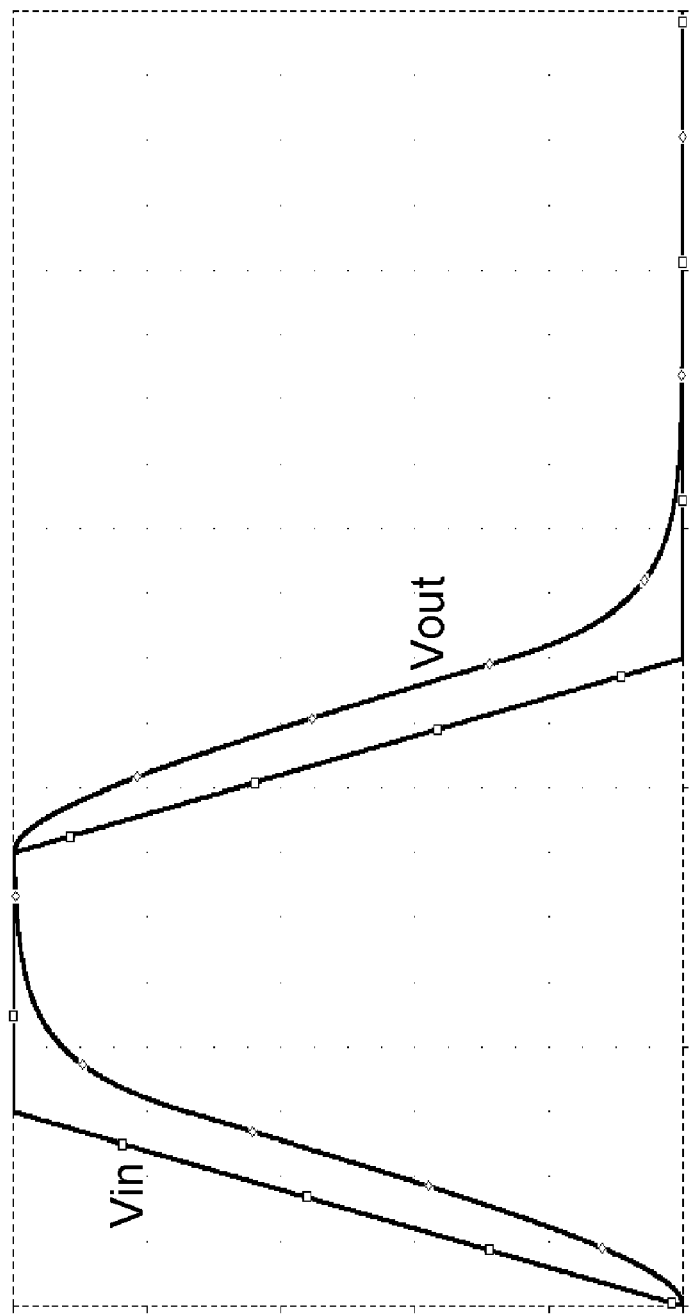
FIG. 9 shows simulation results of the RC circuit of FIG. 7, but with a reduced time constant.

To reduce the filtering action of the circuit the RC time constant may be reduced. The simulated result is shown in FIG. 9. The simulation shown in FIG. 9 is analogous to the simulation shown in FIG. 8, but with a reduced time constant in the simulated delay circuit. Reducing the time constant helps to increase or maintain the bandwidth (note the slopes of both the input and output pulses) but as shown in FIG. 9 the signal delay introduced is lower.

In the simulation of FIG. 9 the pulse width is 0.7 second and the RC time constant in the circuit is 79 ms. The long pulse duration and the long RC time constant were chosen merely for convenience in the simulations to study the effects of circuit choices, and are not representative of the time scales of the embodiment.

Figure 10:
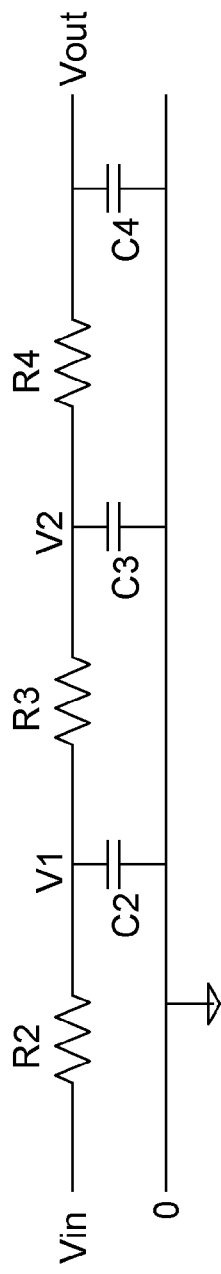
FIG. 10 shows a delay circuit made from a cascade of RC stages.

One method of attempting to regain the delay (as shown in FIG. 8 with respect to the circuit of FIG. 7 with the original time constant) is to cascade a number of RC stages as shown in FIG. 10. Shown in FIG. 10 is a delay circuit made from a cascade of three RC stages, comprising the components R2, C2, R3, C3, R4, and C4, preferably, each RC stage having individually the same time constant of 79 ms. The signals after the first and second stages are labeled V1 and V2 respectively. The input and output of the circuit as a whole are labeled Vin and Vout.

Figure 11:
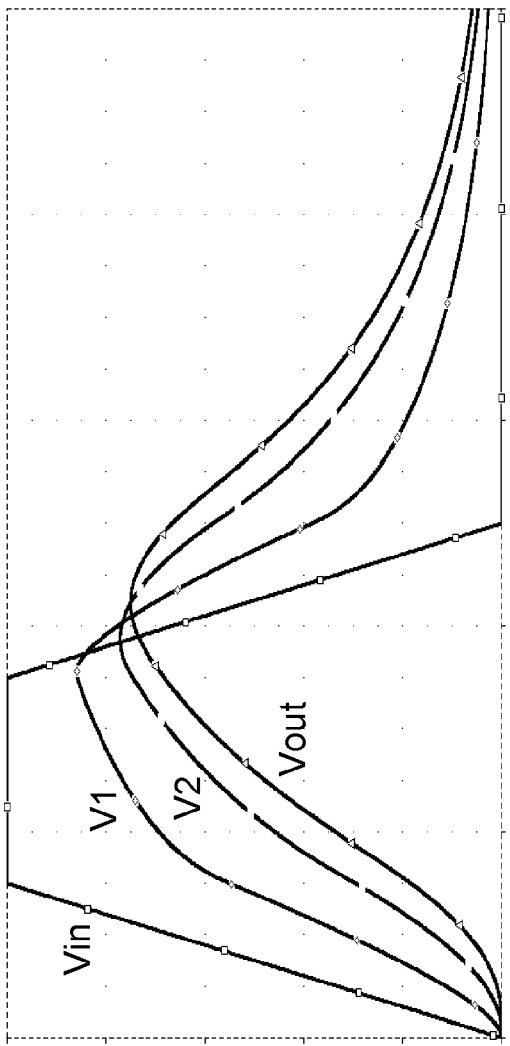
FIG. 11 shows simulation results of the circuit of FIG. 10.

The result of simulating the circuit of FIG. 10 with a trapezoidal input pulse is shown in FIG. 11 which shows the waveforms of the trapezoidal input pulse (Vin) and the waveforms of the delayed pulses after each stage of the circuit of FIG. 10 (V1, V2, and Vout). The resulting final waveform Vout is delayed but it is considerably reduced in amplitude and dispersed.

Figure 12:
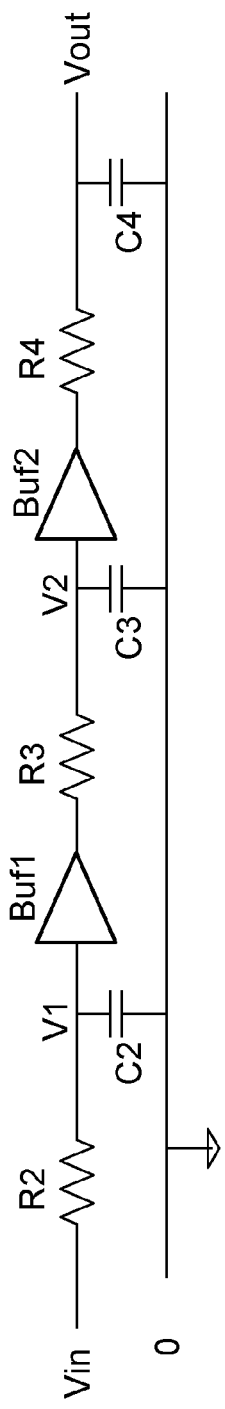
FIG. 12 shows a cascaded delay circuit with buffers.

In order to remove the loading effect of subsequent stages, each stage may be buffered as shown in FIG. 12. Shown in FIG. 12 is the same cascaded delay circuit as in FIG. 10, but two buffers (amplifiers) are inserted, a buffer "Buf1" between R1 and R2, and a buffer "Buf2" between R2 and R3. As a result, the intermediate signals V1 and V2 are not attenuated by the loads of the subsequent stages.

Figure 13:
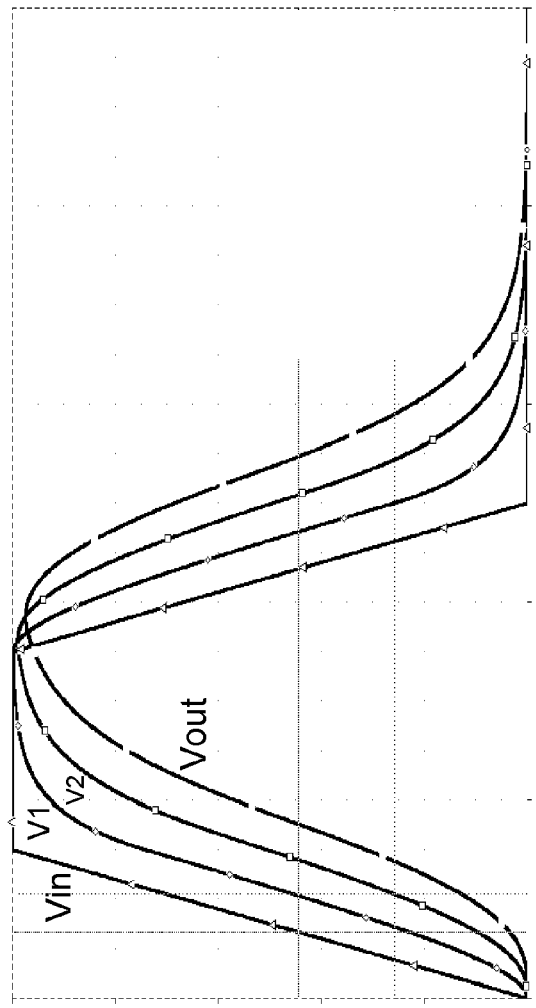
FIG. 13 shows simulation results of the circuit of FIG. 12.

The simulation results for the circuit of FIG. 12 are shown in FIG. 13. They show that the circuit arrangement of FIG. 12 achieves the desired goal of introducing significant delay while the distortion in the pulse is kept to a minimum. In this simulation the 0.7 second trapezoidal input pulse is delayed by approximately 77 ms per stage.

In a mathematical sense, the pulse has been transformed by a cascade of single pole unity gain stages, the transfer function of each stage being;

$$H(s)=1/(1+s/p) \text{ where } p[\text{Rads}]=1/(RC)$$

or $p[\text{HZ}]$ is $1/(2\pi RC)$

The goal of the circuitry is to delay the pulse by up to about half the pulse width (bit width). In the case illustrated in the simulation of FIG. 13, the required delay would be approximately 0.35 seconds. To achieve this delay with the scheme shown in FIG. 12, this would require approximately five stages. In the simulation shown in FIG. 13 the RC time constant is set to 79 ms which sets the pole frequency at $1/(2\pi 79 \text{ ms})=2$ Hz. Thus, with a pulse width of 0.7 seconds (the input pulse Vin) a stage with a pole frequency of 2 Hz will produce suitable delays with acceptable filtering on the pulse. A simple approximation to calculate the position of the pole for a system with a bit rate of N bits per second (Nbps) is to set the pole in each stage at 3*N Hz. For example, with a data rate of 1 Gbps, a stage with a pole at approximately 3 GHz would be needed.

Figure 14:
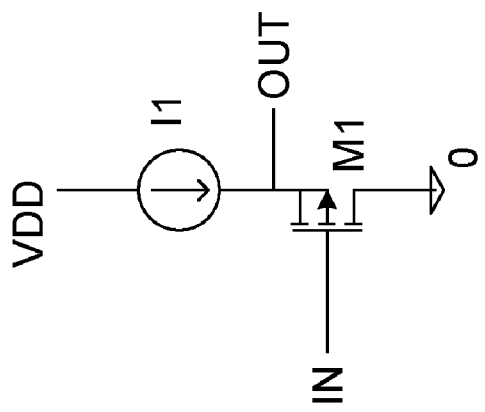
FIG. 14 shows a simple follower circuit.

Having shown how an appropriate delay per stage has been achieved using simple RC stages, it remains to be shown how a suitable buffer amplifier (Buf1, Buf2 in FIG. 12) are constructed. To make a unity gain buffer with unity gain up to 3 GHz is a challenge even on an advanced CMOS processes. A starting point would be to use a simple follower circuit as shown in FIG. 14. The simple follower circuit of FIG. 14 includes an N-channel MOS field-effect transistor (MOSFET) M1 connected in series with a current source I1. The drain of the transistor M1 is connected to ground (0), while the positive terminal of the current source I1 connects to the supply voltage VDD. The circuit input (IN) is connected to the gate of the transistor M1, and its source provides the circuit output (OUT).

Figure 15:
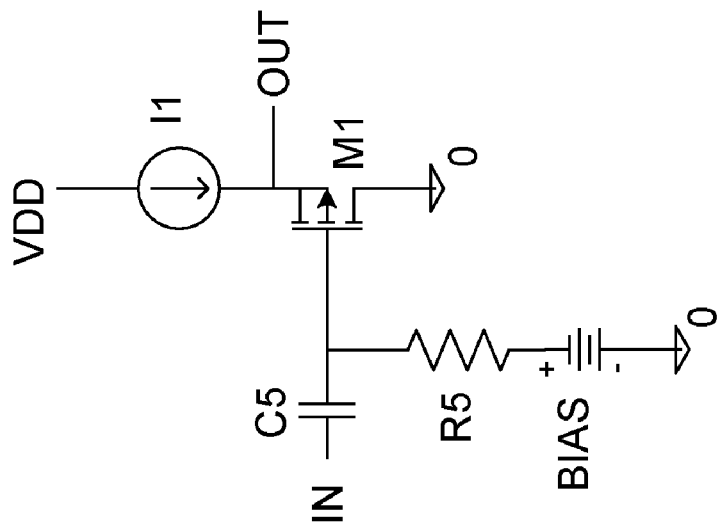
FIG. 15 shows an AC-coupled follower circuit.

In this well known circuit, the output OUT follows the input IN with a gain of approximately one. The first limitation with this circuit is that the output is typically level shifted by 0.3 volts or so. This level shifting is a problem if a number of stages are to be cascaded, because the successive level shifts will cause the output to rise to the supply voltage and thus the signal is clipped. To solve this limitation, AC-coupling is added to the simple follower as shown in FIG. 15. The circuit shown in FIG. 15 is an AC-coupled follower circuit, derived from the simple follower circuit of FIG. 14 by the addition of a capacitor C5 between the circuit input (IN) and the source of the transistor M1, and a resistor R5 between the source of the transistor M1 and a bias supply "BIAS" that provides a bias voltage.

With AC-coupling, the fact that the output of the stage is level shifted up from the bias level set by "BIAS" in FIG. 15 becomes unimportant when stages are cascaded, because this level shift is stored as a constant drop across the input capacitor of the next stage. This essentially resets the average input voltage at each stage to be the bias voltage set by the bias supply (BIAS) shown in FIG. 15.

A further limitation of this circuit comes from the non-zero output conductance of the transistor M1. The gain of the follower is given by gm1/(gm1+gds1). Here "gm1" is the small signal transconductance and "gds1" is the small signal output conductance of M1. Clearly, for all values of "gds1" greater than zero the gain of the stage is less than one. When fast wideband circuits are required, the length of the MOSFET M1 is reduced to close to minimum. This causes "gds1" to increase to a point where the gain is now tending to 0.9 or so. A cascade of these stages would dramatically reduce the magnitude of the incoming signal.

One possible architecture, which corrects for this reduced stage gain is shown in FIG. 16 illustrating a simplified block diagram of a buffered delay stage 400, which is an implementation of the delay unit 306 of the adjustable delay 300 (FIG. 6).

The buffered delay stage 400 comprises a unit gain amplifier (buffer) 404. A separate RC delay element is not required in the high speed application as the delay is implicit in the poles (limited bandwidth) of the amplifier, and so indicated in the figure. The buffer 404, having an input 410 and an output 412, provides for isolating the delay element 402 from the next delay element in the cascade, as described earlier (FIG. 10).

The input 410 of the buffer 404 receives the input signal VIN of the buffered delay stage 400 and the output 412 of the buffer 404 generates the output signal VOUT of the buffered delay stage 400.

The buffer 404 includes two amplifiers in parallel, a follower stage 414, having a gain of approximately 0.9 and a supplementary stage 416 with a gain of approximately 0.1, both amplifiers having the same frequency response (expressed mathematically by the pole $1/(1+s/p)$). Both amplifiers (414 and 416) share the input 410 of the buffer 404, and their outputs are summed into the output 412.

Figure 17:
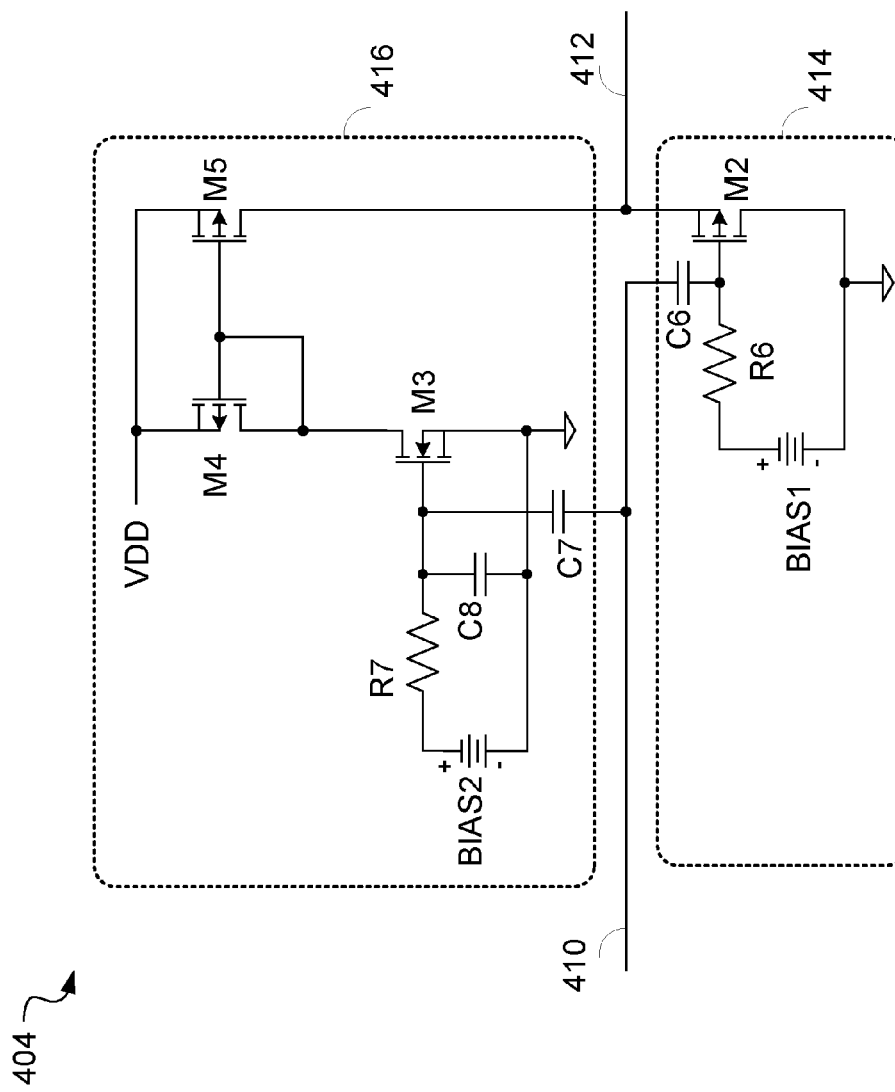
FIG. 17 shows an implementation of the buffer 404 of the buffered delay stage 400 of FIG. 16.

The preferred embodiment of the buffer 404 including its component amplifiers (the follower stage 414 and the supplementary stage 416), is shown in detail in FIG. 17, as a circuit based on an N-well CMOS process.

The follower stage 414 is an AC-coupled circuit, similar to the AC-coupled follower circuit of FIG. 15. It comprises a P-channel follower transistor M2, a biasing resistor R6, a coupling capacitor C6, and a bias supply "BIAS1".

The supplementary stage 416 includes a N-channel amplifying transistor M3, and two P-channel transistors M4 (functioning as a diode) and M5 (functioning as a current source); a biasing resistor R7; a coupling capacitor C7; a shunt capacitor C8; and a bias supply "BIAS2".

The bias voltages of "BIAS1" and "BIAS2" are adapted to the circuit functions and the technology as required.

The input 410 of the buffer 404 is connected through the coupling capacitor C6 to the gate of the transistor M2, and through the coupling capacitor C7 to the gate of the transistor M3. The positive terminal of the bias supply "BIAS1" is fed to the gate of the transistor M2 through the biasing resistor R6. Similarly, the positive terminal of the bias supply "BIAS2" is fed to the gate of the transistor M3 through the biasing resistor R7. The negative terminals of "BIAS1" and "BIAS2", the drain of the transistor M2, the source of the transistor M3, and one terminal of the shunt capacitor C8 are connected to ground. The other terminal of the shunt capacitor C8 is connected to the gate of the transistor M3. The source of the follower transistor M2 is connected to the drain of the current source transistor M5 and the output 412 of the buffer 404. The drains of the transistors M3 and M4 are connected together, and also to the gate of the transistor M4. The sources of the transistors M4 and M5 are connected to the supply voltage VDD.

Functionally, the signal of the input 410 of the buffer 404 is amplified by the follower stage 414 with a gain of about 0.9, the transistor M5 (in the supplementary stage 416) providing a current source load to the transistor M2 of the follower stage 414. The function of the supplementary stage 416 is to amplify a portion of the same input signal (the portion being defined by the ratio of the coupling capacitor C7 to the shunt capacitor C7) in the transistor M3 into a varying current that is mirrored through the transistors M4 and M5, and so providing a varying current source load to the follower transistor M2. Thus, both the follower stage 414 and the supplementary stage 416 contribute to the signal at the output 412 of the buffer 404, their individual contributions effectively being added as indicated in FIG. 16 above.

The gain of the P-channel follower (414) is essentially unity except for the output conductance (gds) of the P-channel device (M2). Because of the requirement for speed a short P-channel device is required and thus the device has a large output conductance and the gain falls toward 0.9. With a cascade of 5 stages the signal would have fallen to 60% of its original value. To boost the gain of the simple follower at channel data rates, the parallel signal path is provided in the form of the supplementary stage 416.

As described above, the buffer 404 includes a second path (the supplementary stage 416) for the input signal (410) to arrive at the output 412. This extra path is through C7, M3, M4, and M5. In this path, the high frequency input signal is passed though C7 and a fraction of the signal is presented at the gate of M3. This fraction is changed by changing the size of the shunt capacitor C8. The current in M3 is set to a nominal value with a bias circuit ("BIAS2"). When the input signal arrives at the gate of M3 it varies the current in M3. This current variation is sourced by the diode connected device (M4) which then mirrors the current change to M5. Finally M5 changes the current in M2 so the end result is that changing the input signal changes the current in M2. Changing the current level in M2 changes the overdrive in the device and thus changes the output voltage. In summary, a positive change at the input 410 causes a positive change at the output 412 due to current steering in the parallel path. At the same time there is a positive change at the output due to the simple follower action through M2. The overall change in the output is calculated by summing the contributions from the Parallel (supplementary stage 416) and Main (follower stage 414) paths. If the main path is producing a gain of 0.9 the parallel path may be tuned to provide a gain of 0.1 by changing the value of C8. Once adjusted to unity, the gain of the stage remains stable over Process, Supply Voltage, and Temperature to within about two percent of its nominal value.

The buffer circuit 404 of FIG. 17 meets the following requirements.

An overall gain of unity, and thus cascading does not amplify or reduce the signal;

Capable of very wideband operation (pole at 2 GHz to 10 GHz) for minimal distortion; and Input and Output levels of a cascade of stages stay within a suitable range.

Some typical values for the implementation of the buffer 404 are:
R6=200 k, R7=200 k, C6=200 f, C7=200 f, C8 in the range of about 400 f tuned to adjust the overall gain of the circuit to unity.

An implementation of the buffer, equivalent to the buffer circuit 404 shown in FIG. 17, is created by starting with a simple N-channel follower (instead of the P-channel follower of FIG. 14, that has led to the complete buffer implementation shown in FIG. 16). The simple N-channel follower is shown in FIG. 18.

Figure 18:
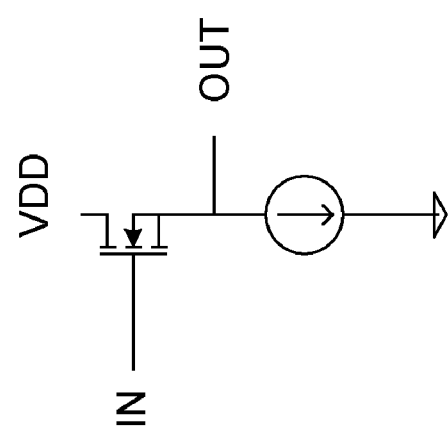
FIG. 18 shows a simple N-channel follower.

For a CMOS process with a P-Well technology the configuration shown in FIG. 18 would be the preferred implementation in that the bulk of the N-channel MOSFET would be free to be tied to the source as shown in FIG. 18. For the more standard CMOS processes with N-Well technology the circuit of the buffer of FIG. 18 would cause additional challenges because the bulk connection on the N-channel MOSFET is tied to ground. This grounded bulk causes a varying source-to-bulk potential in the transistor and further degrades the gain of the stage from 0.9 and this reduced gain makes it more difficult to maintain the overall gain of the stage at unity.

Figure 19:
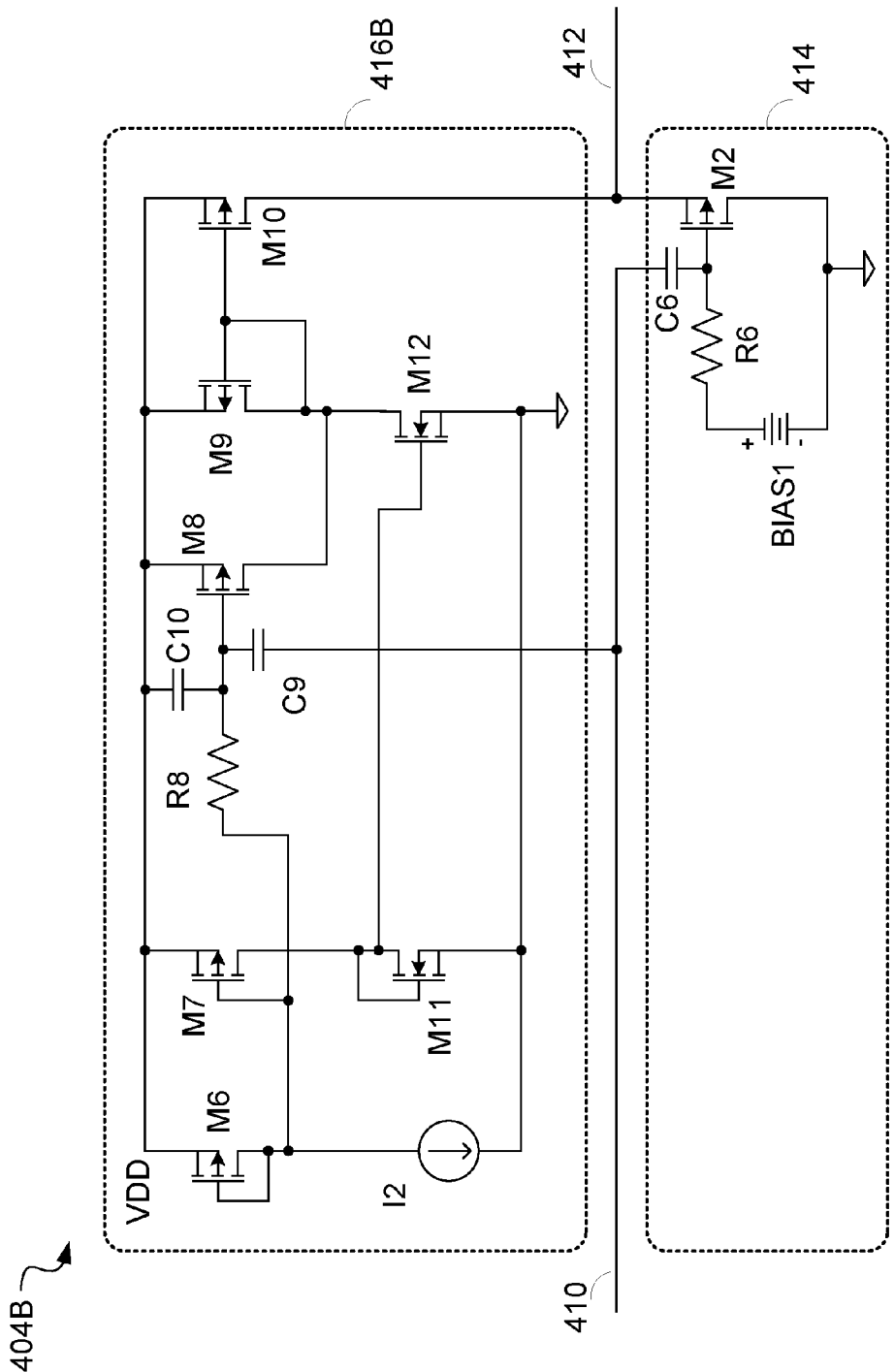
FIG. 19 shows a modified buffer 404B as an alternative implementation of the buffer stage for the delay stage 306 of FIG. 6.

Another implementation of the buffer stage for the delay stage 306 is shown in FIG. 19, which shows a modified buffer 404B. The modified buffer 404B is similar to the buffer 404 and also uses two parallel paths for the input (410) to output (412) signal, i.e. the follower stage 414 and a modified supplementary stage 416B. The modified supplementary stage 416B performs the same function as the supplementary stage 416, but is implemented somewhat differently.

The supplementary stage 416B comprises five N-channel transistors (M6, M7, M8, M9, and M10) and two P-channel transistors (M11, M12), a biasing resistor R8, a coupling capacitor C9, a shunt capacitor C10, and a current sink 12.

The components of the supplementary stage 416B are variously connected to each other, ground, and VDD as listed in the following:

the sources of the N-channel transistors (M6 to M10) and one lead of the shunt capacitor C10 are connected to VDD;

the sources of the P-channel transistors (M11 and M12) as well as the negative terminal of the current sink 12 are connected to ground;

the transistors M6, M9, and M11 are each connected in diode mode, i.e. their gates are shorted to their drains;

the drain/gate of the transistor M6 is connected to the positive terminal of the current source 12, the gate of the transistor M7, and through the biasing resistor R8 to the gate of the transistor M8;

the drain of the transistor M7 is connected to the drain/gate of the transistor M11 and to the gate of the transistor M12;

the gate of the transistor M8 is further connected to the shunt capacitor C10, and through the coupling capacitor C9 to the input signal (410);

the drain of the transistor M8 is connected to the drain/gate of the transistor M9, to the gate of the transistor M10, and the drain of the transistor M12; and lastly the drain of the transistor M10 is connected to the drain of the transistor M2 of the follower stage 414 as well as the output 412.

In this configuration (the supplementary stage 416B), the circuitry formed by the current sink 12 and the transistor M6 provides a bias voltage (from which, through the resistor R8, the operating point of the transistor M8 is set; and further, through the current mirror formed by M11 and M12, the current drawn by the transistors M8 and M9 is set.

The input signal (410) fed through the coupling capacitor C9 to the gate of the transistor M8 modifies the current in the transistor M8 and thus modifies the current in the transistor M9 (the current in M9 is the difference between the constant current set in M12 and the signal dependent current in M8), and consequently the current in the transistor M10 due to the mirroring of M9 and M10. The variation of current in the transistor M10 which is in series with the transistor M2 in the follower stage 414, has the same effect as that described earlier for the variation in the equivalent transistor M5 of the original supplementary stage 416.

Again, a configuration similar to the circuitry of the buffer 404B may be produced if one starts with an N-channel follower as shown in FIG. 18 above.

Equalization 206

The output of the cable shows a low pass filtered response and thus there is significant distortion to the incoming signal. The challenging features of the distorted signal are reduced rise times and the fact that a single data bit change does not cause the signal to traverse the signal range.

Figure 20:
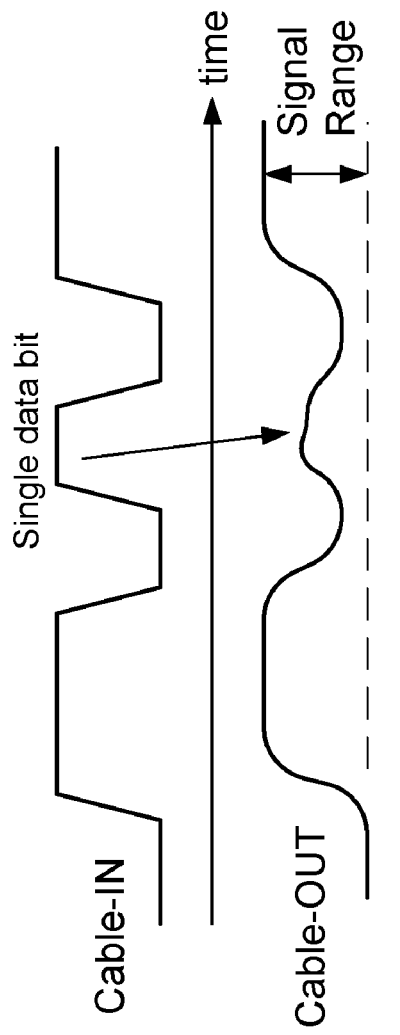
FIG. 20 shows typical waveforms at the input and the output of a cable.
Figure 21:
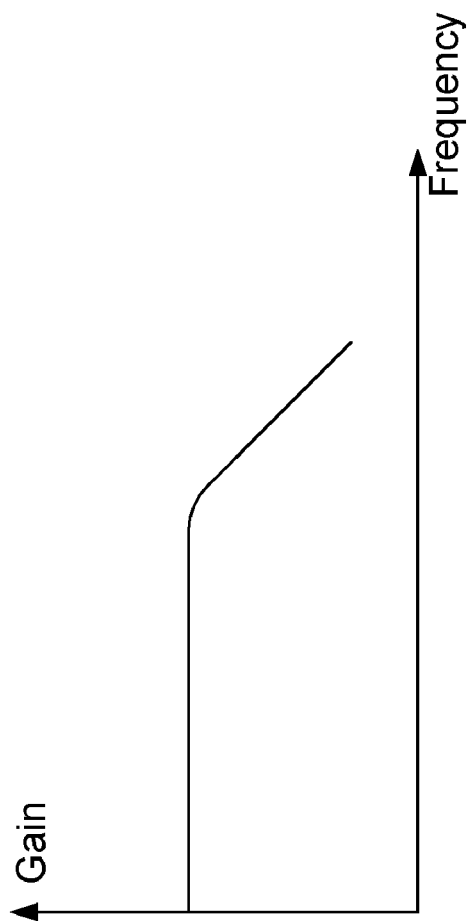
FIG. 21 shows a simplified transfer function of a cable.

FIG. 20 shows typical waveforms at the input and the output of a cable, for illustration of this common problem. The limited bandwidth of the cable suppresses the high frequency components of the data signal. A simplified transfer function of a cable illustrated in FIG. 21 shows the reduction in gain at high frequencies.

Figure 22:
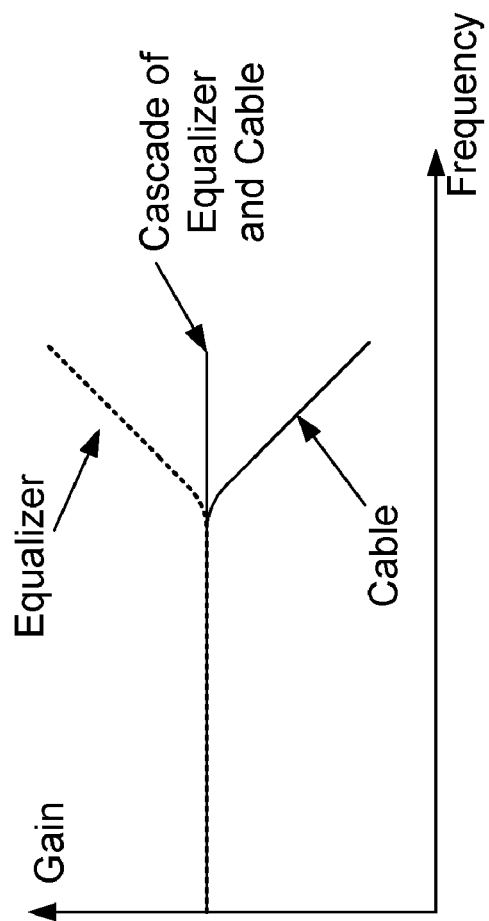
FIG. 22 shows an equalized transfer function.

The high frequency suppression is conventionally solved by placing an equalizer in the receiver. The equalizer provides an increased gain at the higher frequencies so the cascading of the transfer functions results in a flat unity gain transfer function over the frequencies of interest as shown below in FIG. 22.

This existing approach to solving the problem is described, e.g. in a U.S. Pat. No. 6,819,166. This existing implementation describes an equalizer with a variable transfer function, and a method of detecting the level of high frequency suppression in the cable such that the equalizer can be tuned to accurately offset the impact of this.

In the embodiment of the present invention, a tunable equalizer is provided in the Equalization block 206 (FIG. 2). Instead of providing infinitely variable equalization, only three discrete settings (low, medium, and high) are implemented, which may be selected under control of the equalization parameters 230. In combination with the ability to provide differential deskewing of the signal (see Differential Deskew block 204, FIG. 5 above), this amount of equalization control has been found sufficient for the intended first application in an HDMI receiver. Other applications may require finer control.

Analog Phase Recovery (Linear Phase Compensator 210)

After being converted to the single-ended signal 226 in the Differential-to-Single-Ended block 208 (see FIG. 2), the data is now ready to be sampled to extract the data. The problem, however, is that the phase of the data relative to the sampling clock is unknown. When this phase relationship is unknown, there is a danger of sampling during data transitions and misinterpreting the data in the data stream. To define the phase relationship between the on-board clock (PH0 of the recovered multi-phase clock 118) and the data (the single ended signal 226), an Analog Phase detector (within the Linear Phase Compensator 210) is used. The frequency of the data and the onboard clock are equivalent because the timings in both are derived from the same source, that is, the transmitted clock, so there is no need for frequency adjustment. The Linear Phase Compensator 210 employs a scheme similar to that described in the paper entitled "A 10-Gb/s Clock Recovery Circuit with Linear Phase Detector and Coupled Two-stage Ring Oscillator" by Afshin Rezayee and Ken Martin. This paper, which is incorporated herein by reference, was published at the European Solid State Circuits Conference (SSCIRC) in Florence, Italy in the year 2002, pp. 419-422.

In this phase detection scheme of Rezayee and Martin, a window in time is generated around rising edges in the data stream. The phase detector is only enabled within this window. The window is of such a length that one clock edge is guaranteed to be present, but only one. In the Rezayee & Martin implementation, the clock and data are locked such that clock edges occur in the middle of the data bits. This allows the aligned clock to sample in a region where the data is stable.

In the implementation of the phase detector circuit described herein, the Linear Phase Compensator 210 aligns the clock and data edges. The resulting phase aligned data signal (the phase aligned signal 232) is subsequently oversampled in a separate circuit block (The Oversampling and Reclocking block 212) before determining the bit value (in the Bit Extractor block 214).

Figure 23:
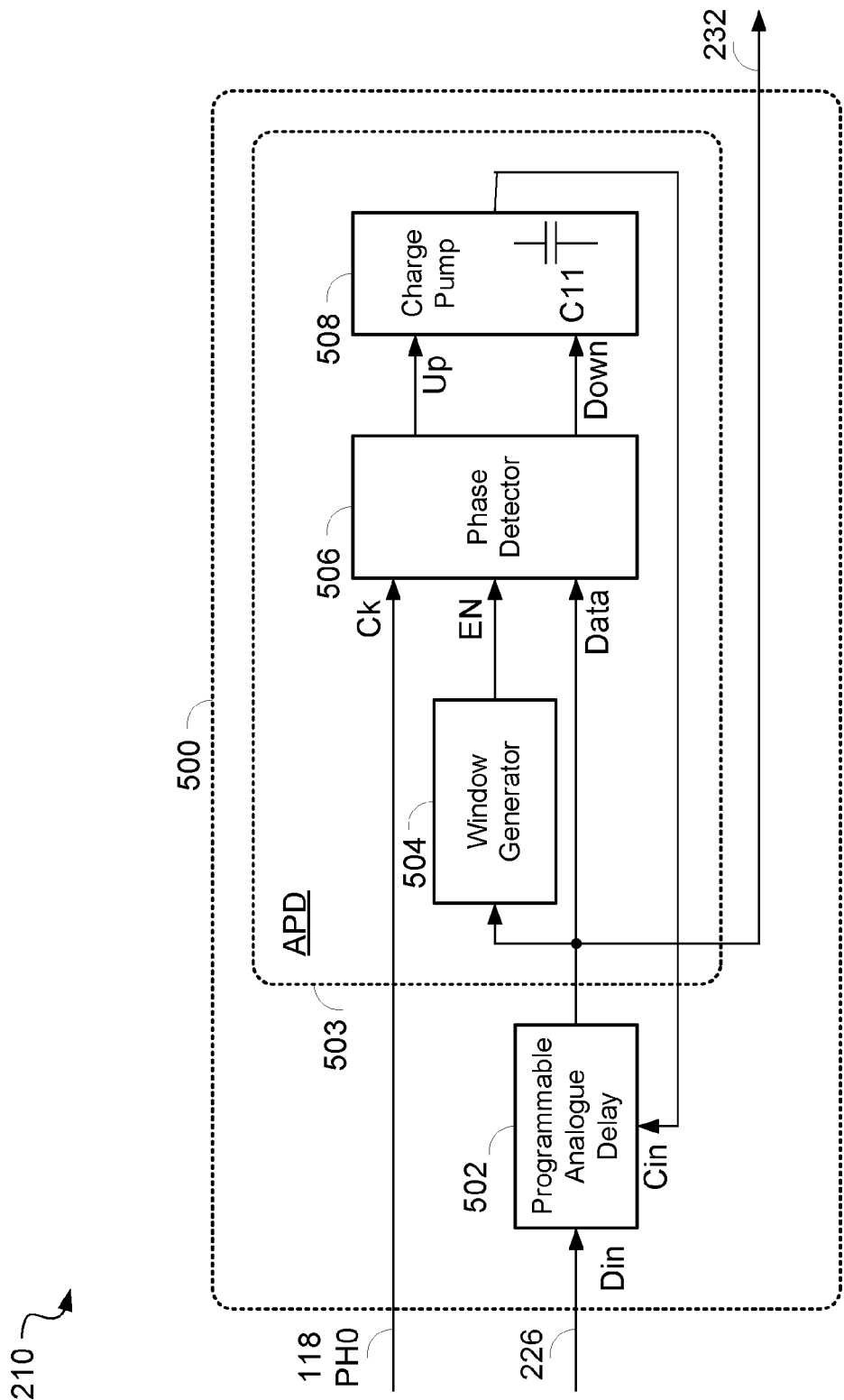
FIG. 23 shows a block diagram of an exemplary implementation 500 of the Linear Phase Compensator 210 of FIG. 2.

A block diagram of an exemplary implementation 500 of the Linear Phase Compensator 210 is shown in FIG. 23.

The Linear Phase Compensator 210 (the implementation 500) comprises:

a Programmable Analogue Delay 502 having a data input (Din) and a control input (Cin); and an Analog Phase Detector (APD) 503, which includes:

a Window Generator 504;
a Phase Detector 506 having a clock input "Ck", a data input "Data", and an enable input EN;
and a Charge Pump 508 with inputs "Up" and "Down", and including a capacitor C11.

The inputs to the Linear Phase Compensator 210 are the data signal (the single ended signal 226), and the clock signal (the PH0 of the recovered multi-phase clock 118). The data signal is connected to the data input (Din1) of the Programmable Analogue Delay 502, the output of which is the phase aligned signal 232 (the preprocessed data signal). This signal (232) is further connected to the input of the Window Generator 504 and to the enable input "EN" of the Phase Detector 506. The clock input "Ck" of the Phase Detector 506 receives the on-board clock, that is the phase 0 (PH0) of the multi phase clock signal 118 (see FIG. 2). The outputs of the Phase Detector 506 drive the "Up" and "Down" inputs of the Charge Pump 508. The output of the Charge Pump 508 is an analog control signal, connected to the control input Cin of the Programmable Analogue Delay 502.

The Window Generator 504 detects positive edges on the input data and generates the enable (EN) signal for the Phase Detector 506, of duration guaranteed to contain an edge of the clock to which the data is to be locked.

The Phase Detector 506, uses the enable signal (EN), supplied by the Window Generator 504, to compare the phases of the "Data" and "Ck" signals during the length of the enable signal (EN). The outputs of the phase detector control the Programmable Analogue Delay 502, by means of the Charge Pump 508 which is a control voltage generator, generating a control voltage by charging the capacitor C11 or by other suitable means.

The Programmable Analogue Delay 502 takes the control signal from the phase detector (the control input "Cin") and delays the data signal by a programmable amount to align it with the clock signal. The output of the Programmable Analogue Delay 502 is thus the phase aligned signal 232.

This Linear Phase Compensator 210 (implementation 500) works robustly in the presence of ISI (Inter-Symbol Interference) and jitter and aligns the on-board clock edges with the substantially "ideal" data transition points in the data channels.

Bit Extraction 214 and Word Assembly 216

The phase aligned (data) signal 232 is a rail-to-rail analog signal that may still contain ISI, distortion, noise, and other impairments. In the Oversampling and Reclocking block 212 (FIG. 2), this signal is effectively sampled at a rate 12 times the clock rate of the signal, i.e. during each bit period the data signal is sampled at 12 evenly spaced intervals, to generate 12 digital samples. Because of the high speed of the signal (1.65 Gbs) it is not practical to actually sample the signal with a 12-times higher clock signal. Instead, the same effect is achieved by sampling the signal with 12 evenly spaced phases of the clock signal, each clock phase generating a digital sample, thus 12 samples representing one data bit. In the present embodiment, 24 clock phases (PH0 to PH23 of the multiphase clock signal 118) are used to capture not only one data bit in 12 sampling phases, but also the trailing half of the previous data bit in 6 sampling phases and the leading half of the next data bit in another 6 sampling phases (conventional digital register logic and pipelining is used to thus look into the "future").

Because of the oversampling, the term "bit" might become ambiguous. The terms "bit", "primary data bit", and "bit-clock period" will be used to denote the nominal 1.6 Gbs data bits and their period; "sample" and "sample bit" to denote one of the 12 samples per bit-clock period; and "24-sample word" to denote the ensemble of 24 samples, as described.

Thus the Oversampling and Reclocking block 212 generates 24 samples (a "24-sample word") at the bit-clock rate, by outputting the 24-sample digital samples signal 234.

Figure 24:
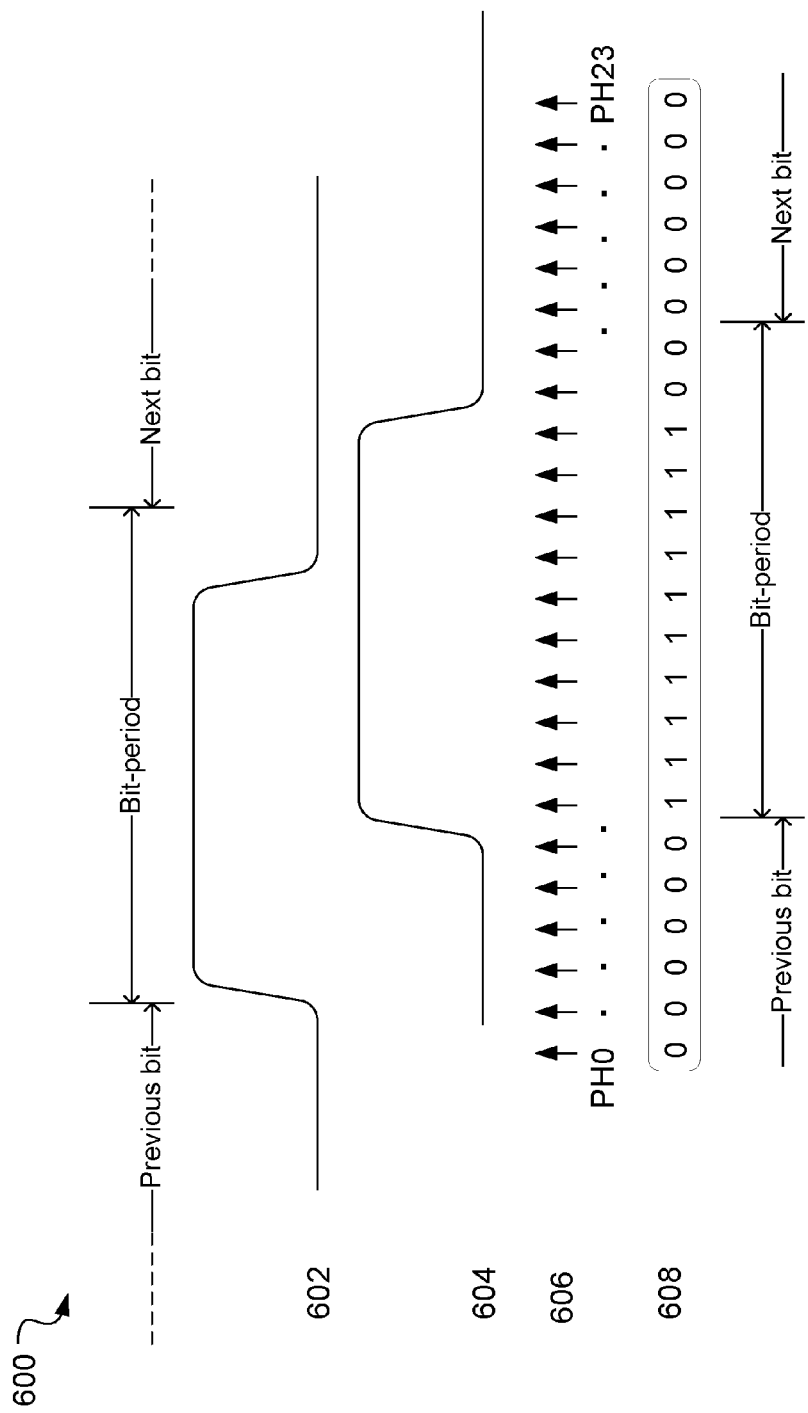
FIG. 24 shows a diagram illustrating data phase shifting in the Programmable Analogue Delay 502 of FIG. 23, and oversampling in the Oversampling and Reclocking block 212 of FIG. 2.

FIG. 24 illustrates data phase shifting in the Programmable Analogue Delay 502 of FIG. 23, and oversampling in the Oversampling and Reclocking block 212 of FIG. 2. The diagram 600 in FIG. 24 that shows an exemplary waveform 602, a delayed waveform 604, a set of sampling clocks 606, a 24-sample word 608, and a scale indicating a bit-period and previous and next bits.

The exemplary waveform 602 represents an example of the single ended signal 226 (FIG. 2) before phase alignment. Note that the signal appears to be a "1" bit with some distortion (noise or ISI) near the one-zero transition, and it is not aligned with the indicated bit-period. The delayed waveform 604 represents the corresponding phase aligned signal 232 after delay through the Programmable Analogue Delay 502. Note that the signal is now approximately aligned with the indicated bit-period, but still includes the distortion. This signal is sampled with the 24 phases of the multiphase clock 118 (PH0 to PH23) as indicated by the set of sampling clocks 606 in the Oversampling and Reclocking block 212, resulting in the 24-sample word 608. The 24-sample word 608 includes six samples (000000) from the previous bit period, twelve samples (111111111100) from the Bit-period and another six samples (000000) from the next bit period.

The 24-sample word 608 is output by the Oversampling and Reclocking block 212 as the 24-sample digital samples signal 234 to the Bit Extractor block 214 (FIG. 2) as well as to the Training Function 218.

In the Bit Extractor block 214 the 24-sample digital samples signal 234 is analyzed to determine probabilistically if the present data bit (represented in the phase aligned signal 232 and sampled at 24 points) is a logic "0" or a logic "1". While this could be achieved with a simple majority voting circuit, the following more elaborate algorithm is used in the preferred embodiment of the invention.

The method searches for the bit in the middle twelve samples, but also in samples either side of this midsection (hence the requirement for six "previous bit" samples and six "next bit" samples). Sample-to-sample jitter can move the bit forward and back relative to the clock, even when on average it is correctly aligned. The approach taken to declaring that the bit is a logic "1" or logic "0" is to accept short bits—down to 5 samples long in the present implementation—if they are located centred on the expected bit centre. Longer runs of samples are accepted even if they are further from the expected centre—this is where the samples from the previous bit and next bit are used.

More precisely, in the present implementation we accept a run of 5 contiguous "1" or "0" samples located within a window of 6 centred on the expected bit centre as a "1" or "0"; for runs of length 6 samples, the window is 10 wide; for runs of 7 samples, the window is 12 wide; for runs of 8 samples, the window is 14 wide; for runs of 9 samples, the window is 16 wide; and for 10 or more samples it is 18 wide.

Eye Quality Tuning (Training Function 218)

The Training Function 218 (FIG. 2) provides feedback from the 24-sample digital samples signal 234, which is a stream of 24-sample words such as illustrated in the 24-sample word 608 of FIG. 24, to the analog front end (AFE 200) in order to tune the adjustable parameters of the AFE.

The approach taken in the preferred embodiment of the invention is to once at startup (or upon any other trigger) systematically go through each of the possible permutations of settings of these parameters; observe and measure the quality of the preprocessed signal 232 oversampled as the 24-sample digital samples signal 234 point (obtain a quality measure in the form of a "Quality Number"); and retain the setting which results in the best Quality Number obtained.

The AFE settings may include (actual values in the example embodiment are shown in brackets, based on the bit oversampling factor of 12):
  settings of differential delay compensation (7 values, ranging from about 0 to approximately 360 psec);
  insertion of the differential delay in the positive or negative polarity signal (positive or negative);
  frequency response (cable) equalization settings (low, medium, high);
for a total of number of permutations of (7×2)×3=42.

Note that the bit-clock to data-bit phase offset setting is not of interest here, being independently adjusted by the Linear Phase Compensator 210. The phase aligned data signal 232 will be fairly accurate in phase, that is centering the nominal bit-period on the middle twelve samples of the 24-sample word, provided the AFE settings are within the vicinity of the optimal settings. If they are not, it does not matter if the data/clock phase alignment is suboptimal.

Implementation of the Training Function 218

Figure 25:
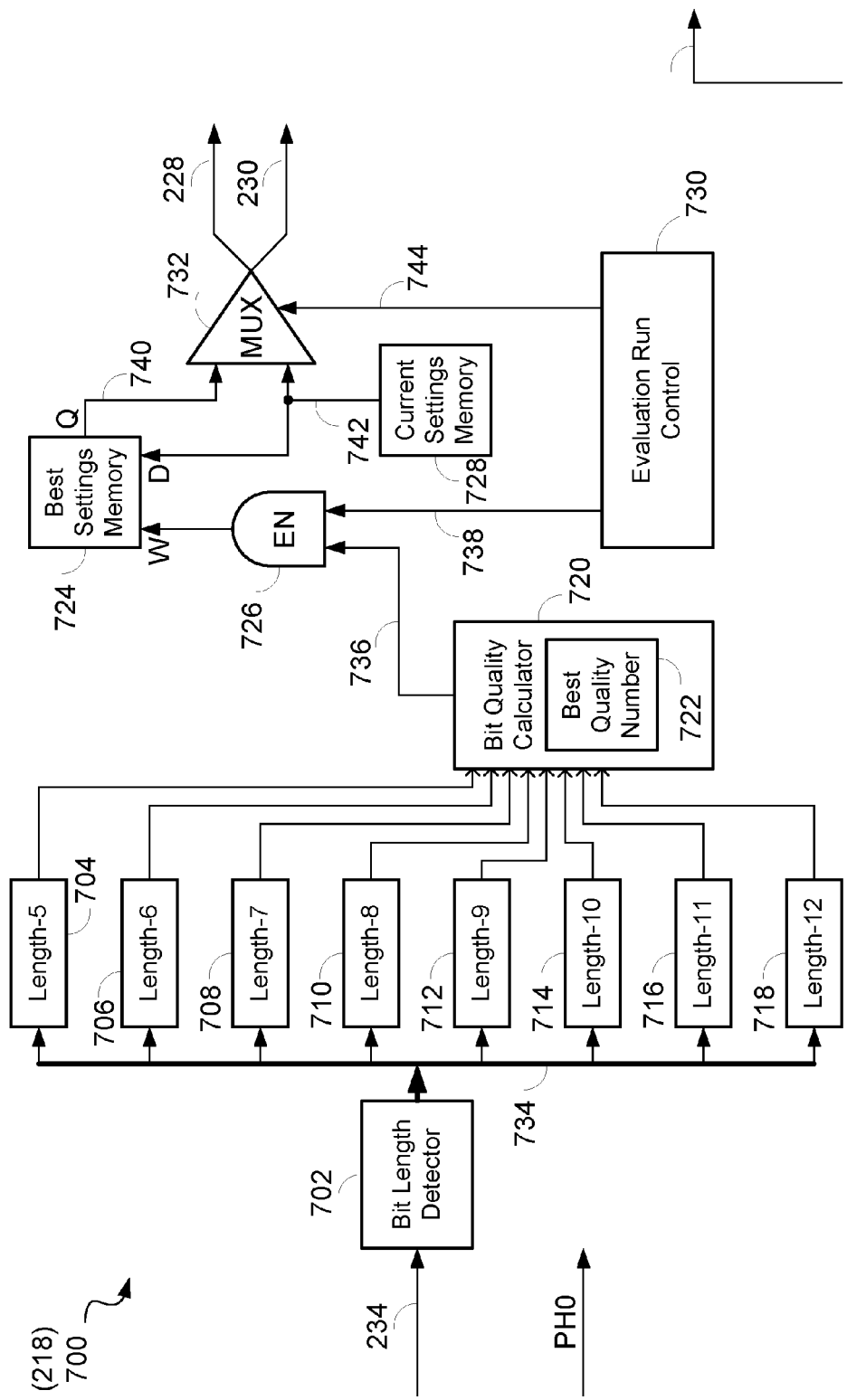
FIG. 25 shows a simplified block diagram of the preferred implementation 700 of the Training Function 218 of FIG. 2.

A simplified block diagram of the preferred embodiment 700 of the Training Function 218 is shown in FIG. 25.

The Training Function 700 includes the following blocks:
  a Bit Length Detection block 702;
  a set of Length-i counters (i=5 to 12), designated by reference numerals 704 to 718;
  a Bit Quality Calculator 720 including a Best Quality Number register 722;
  a Best Settings Memory 724 having inputs D and W, and an output Q;
  a write-enable gate EN 726;
  a Current Settings Memory 728;
  an Evaluation Run Control block 730; and
  a selector MUX 732.

The inputs to the Training Function 700 are the 24-sample digital samples signal 234 that is connected to the Bit Length Detection block 702, and the board clock (PH0 of the multiphase clock signal 218). The output of the Bit Length Detection block 702 is a set 734 of count-enable signals, one count-enable signal connected to each of the Length-i counters 704 to 718. The outputs of each of the Length-i counters 704 to 718 provide inputs to the Bit Quality Calculator 720. The Bit Quality Calculator 720 in turn is connected with a "save best settings enable" control signal 736 to the write-enable gate EN 726. The other input of the write-enable gate EN 726 receives an "end-of-calculation" signal 738 from the Evaluation Run Control block 730. The output of the write-enable gate EN 726 is connected to the write control input "W" of the Best Settings Memory 724. The output Q of the Best Settings Memory 724 sends a multi-bit "best settings" signal 740 which is a digital control word indicative of AFE settings values. The "best settings" signal 740 is connected to one of the two data inputs of the selector MUX 732 whose other data input receives a similar data word, i.e. a "current settings" signal 742 from the Current Settings Memory 728. The "current settings" signal 742 is also applied to the data input D of the Best Settings Memory 724. The outputs of the Evaluation Run Control block 730 include the "end-of-calculation" signal 738 connected the write-enable gate EN 726 (already mentioned above), and an "end-of-search" signal 744 connected to the select input of the selector MUX 732. The output of the selector MUX 732 (outputting either the "current settings" 742 or the "best settings" 740 depending on the state of the "end-of-search" signal 744) is split into the deskew parameters 228 and the equalization parameters 230 that are fed back to the Differential Deskew (204) and Equalization (206) blocks respectively, see FIG. 2.

Figure 26:
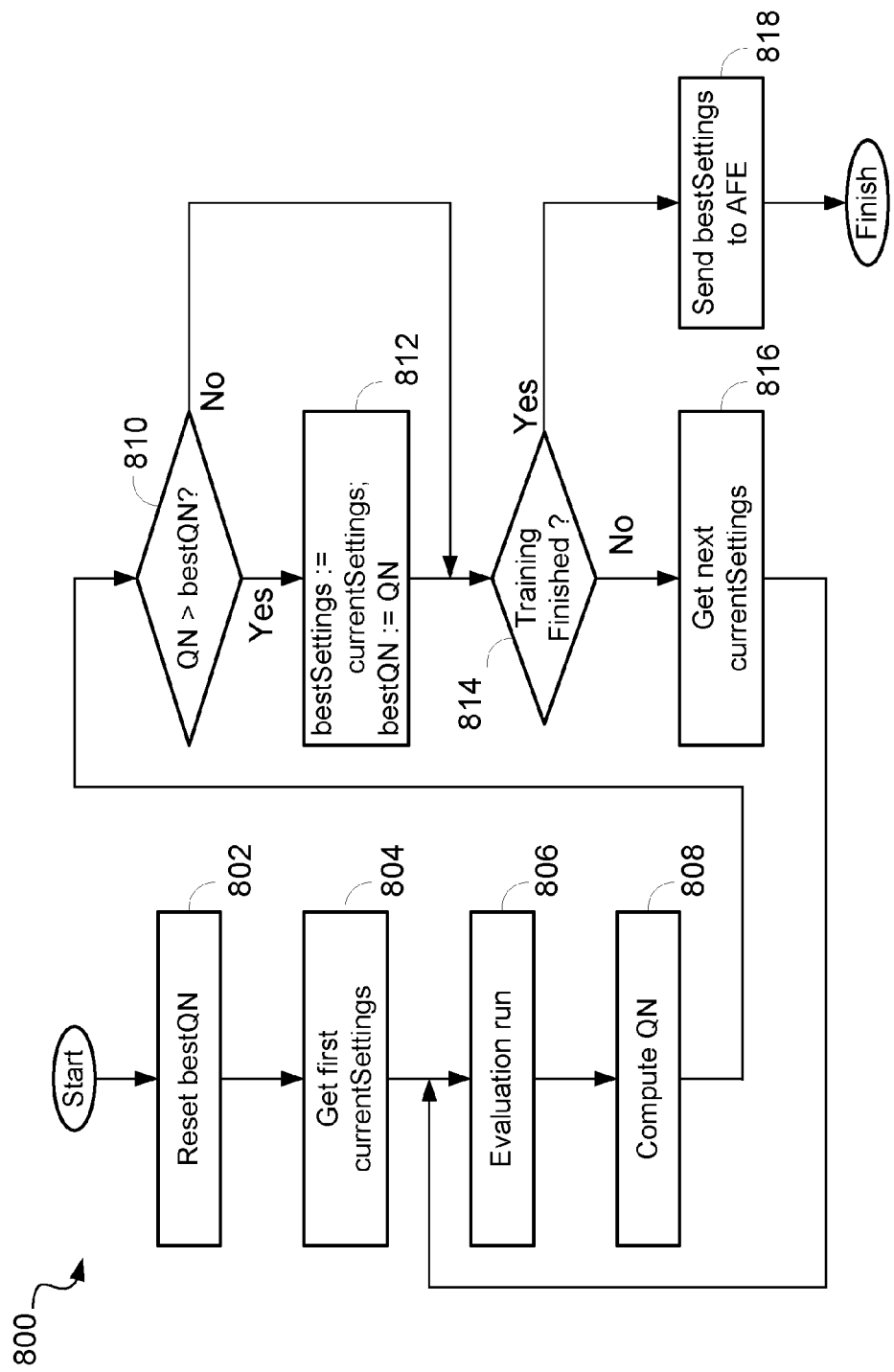
FIG. 26 shows a high level flow chart of a training run 800 of the Training function 700 of FIG. 25.

The overall operation of the Training Function 700 is controlled by the Evaluation Run Control block 730 which, briefly noted, allows the analog front end (AFE) to run (an "evaluation run") for a specific period of time (corresponding to a large number N of received data bits) at each of the predefined sets of AFE parameter settings ("current settings"). Each "evaluation run" of the Training Function 700 runs for a duration equivalent to the N primary data bits (an observation period of "N" bits). A "training run" is the sequence of "evaluation runs", each with a different set of "current settings". The purpose of the "Training Function" is to select the permutation of AFE settings that gives the "best" (highest) Quality Number, and retain these settings for the subsequent operation of the HDMI receiver. The Training Function may be invoked (started) once after power-up. It may also be invoked periodically to allow for drift, equipment connect/disconnect, and other factors. While the Training Function 218 is the primary means to set the AFE parameters based on the Quality Number obtained with the "Bit Quality Calculator" 720, the AFE parameters may not be updated regardless of the Quality Number if the word alignment logic fails to synchronize. The operation of the "training run" is further described with the help of a flow chart (FIG. 26 below). The functions of the individual blocks of the Training Function 700 shown in the FIG. 25 are briefly explained first.

The Bit Length Detection block 702 receives the 24-sample digital samples signal 234 indicating an oversampled received bit (nominally in the middle 12 samples) and samples of adjacent bits, as described above (FIG. 24), and treating it as a digital word of 24 bits (samples); and detects within each such digital word clusters (runs) of adjacent "1s", bracketed by at least one "0" sample at each end. For example the 24-sample word 608 of FIG. 24 "000000111111111100000000" contains a run of ten "1s" samples. The function of the Bit Length Detection block 702 is to classify each arriving 24-sample word 608 by the lengths of the "1s" run (if any) contained in it and increment the corresponding Length-i counter (704 to 718) accordingly. In the example above the Length-10 counter 714 would be incremented.

Note that there are no counters for lengths below 5 or above 12; these lengths are ignored.

The Length-i counters 704 to 718 thus, record and accumulate the number of occurrences of the corresponding run lengths of "1s" in the stream of 24-sample words in the digital samples signal 234, for each evaluation run.

At the end of each evaluation run, the outputs of the Length-i counters 704 to 718 are fed into the Bit Quality Calculator 720 which computes a Quality Number from the ensemble of accumulated length counts according to a heuristic algorithm. Recall that the purpose of "training" the analog front end is to find the "best settings", that is the settings which results in the most appropriate equalization setting (see the Equalization block 206, FIGS. 2 and 22) and which "optimally" removes any differential skew that might exist by adjusting the Differential Deskew 204. An ideal data signal of alternating "1s" and "0s", that was perfectly phase aligned (see Linear Phase Compensator 210, FIG. 23) would after oversampling result in successive 24-sample words of:
000000111111111111000000
111111000000000000111111
. . .
and result in high counts for the run length 12. The runs of length 6 would not be counted, as only contiguous runs of "1" samples with "0" samples on either side of the run are counted. Thus, the six samples located at the end of the window are not counted—they're part of a bit that was or will be counted in the previous or subsequent bit period respectively.

If the signal shape was perfect (twelve "1" samples per bit) but phase alignment was skewed by one or a few samples, the result would be that the same high counts for the run length 12 would be recorded. If the signal was distorted (imperfect differential deskewing, high ISI, or non-optimal equalization setting), other lengths may be recorded.

At the end of an evaluation run the Quality Number is computed by the Bit Quality Calculator 720, by multiplying the contents of each Length-i counter 704 to 718, with a length specific weight, and summing the products:

for i=5 to 12, $$\text{Bit Quality Number} = \text{SUM}(\text{Length}_i \text{ count} \times \text{Weight}_i)$$

The following set of weights have been used in the embodiment of the invention, but other weights may also give good results:
$\text{Weight}_5 = -2$
$\text{Weight}_6 = -2$
$\text{Weight}_7 = -1$
$\text{Weight}_8 = 1$
$\text{Weight}_9 = 1$
$\text{Weight}_{10} = 2$
$\text{Weight}_{11} = 4$
$\text{Weight}_{12} = 8$ The selected weight numbers suggest, as may be expected, that a run length of 12 being indicative of a perfect pulse has the highest weight, while run lengths below 8 may be indicative of severe distortion, resulting in a negative contribution to the Bit Quality Number.

The Bit Quality Number from each evaluation run with a particular set of AFE settings (the current settings) is compared with the currently stored Best Quality Number (in the register 722). If it exceeds the previous Best Quality Number, the Best Quality Number 722 is updated with the higher number, and the current settings is saved in the Best Settings Memory 724. This functionality is indicated in FIG. 25 where the output of the Bit Quality Calculator 720 (the "save best settings enable" control signal 736) is ANDed with the "end-of-calculation" signal 738 from the Evaluation Run Control block 730 in the write-enable gate EN 726 to generate a write signal ("W" input) for the Best Settings Memory 724 while at the same time, the current settings (the "current settings" signal 742 from the Current Settings Memory 728) is presented at the data input "D" of the Best Settings Memory 724, causing it to store the current settings.

If on the other hand with a given current settings, a Bit Quality Number is obtained that is not higher than the Best Quality Number already stored in the register 722, the write-enable gate EN 726 is not enabled, and the current settings is not stored in the Best Settings Memory 724.

The Evaluation Run Control block 730, for each evaluation run, chooses a current settings permutation and stores it in the Current Settings Memory 728 for the duration of the each evaluation run. During each evaluation run, the "current settings" 742 are fed through the selector MUX 732 to provide the deskew and equalization parameters (228 and 230).

After all permutations are exhausted, that is at the end of the "training run", the "end-of-search" signal 744 is asserted by the Evaluation Run Control block 730 which then causes the selector MUX 732 to send the "best settings" into the deskew and equalization parameter signals (228 and 230).

In the present embodiment of the invention, the number of received data bits N for which each evaluation run is held, is 65536. Due to present technology limitations, the blocks 702 to 718 of the Training Function circuit 700 are duplicated (duplication not shown in FIG. 25). Each of these blocks operates at half speed, processing the 24-sample digital samples signal 234 for alternate received data bits with the Bit Quality Number simply computed at the end of each evaluation run from the contents of the Length-i counters of both sets of counters. Thus in effect, a total of 2N=131072 bits are processed for each evaluation run, and with the chosen set of AFE parameters (42 permutations, see above) 42 evaluation runs are made for one training run. At a data rate of 1.6 Gbs, the complete training run thus occupies a period of approximately 4 msec, which is short enough to justify the approach taken here, that is to systematically try all permutations and retain the best. If substantially more parameters were to be included and many more permutations were possible, then more complex search strategies could be applied to shorten the training period.

Alternative implementations of the Training Function 218 are also envisaged which may differ in the details from the embodiment 700. For example, the number of clock phases for oversampling the received data signal may be less or more than 24, and the window of oversampling may include at least one bit period (the middle samples), but be narrower or wider with respect to adjacent bits. Instead of counting run lengths of "1" samples, run lengths of "0" samples may be accumulated, and different weightings may be applied to the run length counts. These and other variations that may occur to skilled persons are included in the scope of the invention.

In FIG. 26 is shown a high level flow chart of a training run 800, depicting the operation of the Training Function 218 (corresponding to the embodiment 700 of FIG. 25). The training run 800 is a finite process that may be invoked to run from "Start" to "Finish" through a number of steps that are either actions or logic decisions:

802: "Reset the best Quality Number (bestQN)";
804: "Get the first current Settings";
806: "Do an Evaluation run";
808: "Compute a Quality Number (QN)";
810: "Is the computed Quality Number greater than the best Quality Number (QN>bestQN)?", Yes or No;
812: "Set the best Settings to the current Settings, and set the best Quality Number to the computed Quality Number (bestSettings:=currentSettings; bestQN:=QN);
814: "Is Training Finished?", Yes or No;
816: "Get the next current Settings"; and
818: "Send the best Settings to the Analog Front End (AFE)".

The current Settings refers to the parameters that may be controlled in the analog front end (AFE 200). At the start of the training run, a stored variable "best Quality Number" (bestQN) is initialized ("reset bestQN" 802) and a first set of the AFE parameters is created ("Get first currentSettings" 804). This is followed by a loop over the steps 806 ("Do an Evaluation run") to 816 ("Get the next current Settings") which is executed until all settings (permutations of the AFE parameters) have been exhausted and training is finished, as indicated by the step 814 ("Is Training Finished?"). The training run 800 ends with the step 816 ("Send the best Settings to the Analog Front End").

Within the loop (steps 806 to 816), the step 806 ("Do Evaluation run") is followed by the step 808 ("Compute a Quality Number") which computes the Quality Number from the results of the evaluation run. This step 808 may be performed by the Bit Quality Calculator 720 of FIG. 25, for example. In the next step 810 "Is the computed Quality Number greater than the best Quality", a comparison is made between the last computed quality number (QN) and the stored "best Quality Number" (bestQN). If QN is greater than bestQN then the current settings is assigned and stored in a variable "best Settings", and also the stored variable "bestQN" is updated with the last computed QN (the step 812). In the step 814 "Is Training finished?", it is determined if all valid permutations of the AFE parameters have been evaluated. If training is NOT finished, the next permutation is created in the step 816 "Get next current settings", and the loop continues with the evaluation run (step 806). If there are no more permutations to evaluate, training is finished ("Yes" in the step 814 "Is Training finished?"), the current settings are abandoned, and the best Settings are sent to the analog front end in the step 818, before the training run 800 exits.

Figure 27:
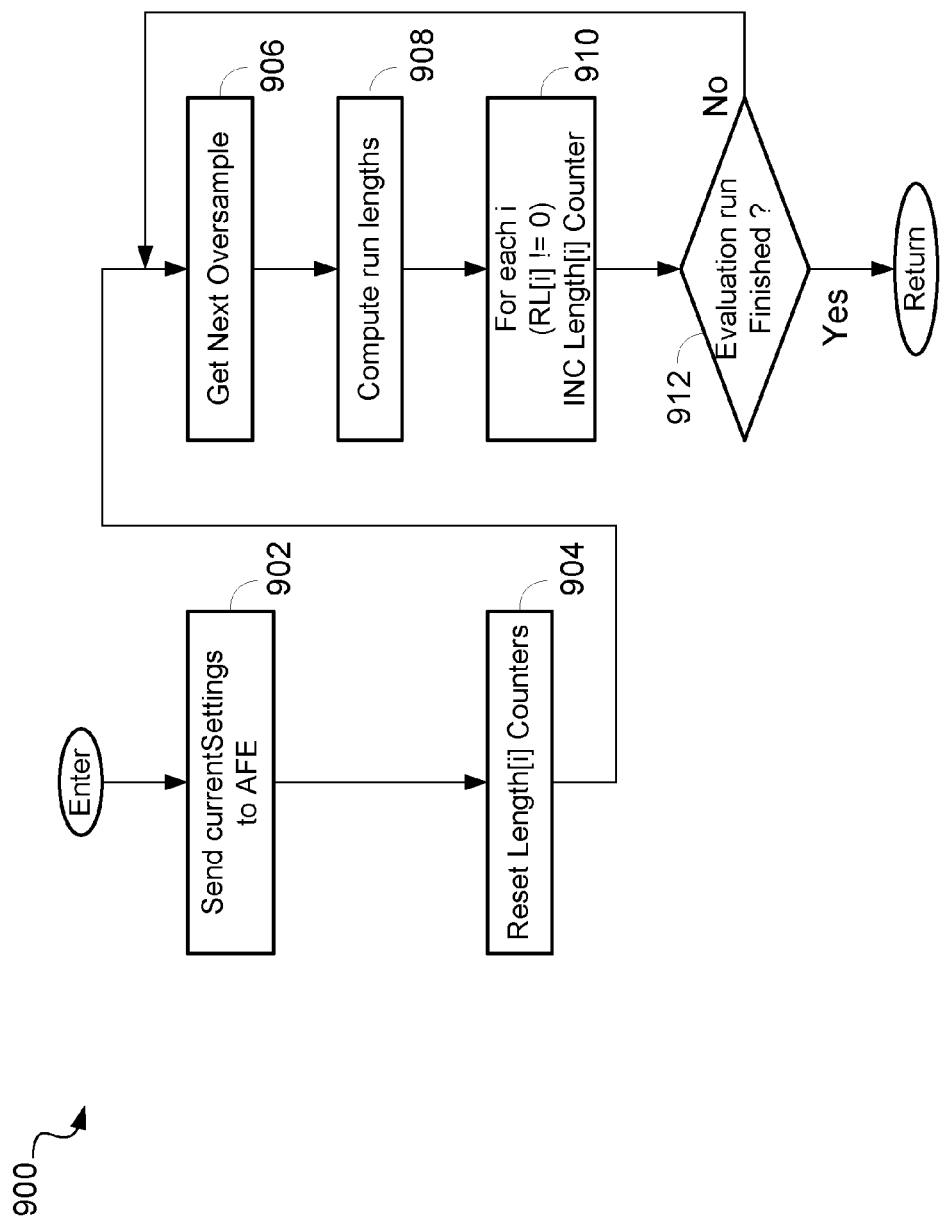
FIG. 27 shows an exemplary evaluation run 900 implementing the evaluation run (step 806) of the training run 800 of FIG. 26.

The Evaluation run of the step 806 is further detailed in a subroutine flow chart of an exemplary evaluation run method 900 that is shown in FIG. 27.

The evaluation run 900 runs from "Enter" to "Return" through a number of steps that are either actions or logic decisions:

902: "Send the current Settings to the analog front end (AFE)";
904: "Reset the Length[i] counters";
906: "Get the next oversampled bit";
908: "Compute the run lengths (RL)";
910: "for each i for which RL[i] is not 0, increment the Length[i] counter";
and
912: "Is Evaluation run finished?".

The current settings (see the flow chart of the "Training run" 800) are sent to the analog front end (AFE) in the step 902, and remain constant for the duration of the evaluation run 900. The run is initialized by resetting all Length counters to 0 in the step 904. These counters correspond to the Length counters 704 to 718 of the embodiment 700 (FIG. 25). Only counters for i=5 to 12 (selected run length 5 to 12) are provided in the present embodiment of the invention, but other ranges may be used, especially if oversampling of the data bits is by a factor different than the factor 12 as in the present embodiment.

The next oversampled data bit and adjacent samples is obtained in the step 906. This "Oversample" corresponds to the 24-sample digital samples signal 234 of the earlier description (FIGS. 2 and 24). In the next step 908 ("Compute run lengths"), the received oversample is analyzed to determine run lengths of "1s" as described earlier (the Bit Length Detection 702, FIG. 25). This step produces an indication for each run length (only run lengths of 5 to 12 are covered) that is found in the oversample. In the next step 910 ("for each i for which RL[i] is not 0, increment the Length[i] counter"), each Length[i] counter for which a run length was indicated in the previous step is incremented.

The end of the evaluation run is indicated in the step 912 "Is Evaluation run finished?" if a sufficient number of data bits (oversamples) have been processed, (in other words, a simple loop count is maintained, and after for example 65536 loopings), the evaluation run exits, that is it returns to the next step 808 in the training run 800 where the contents of the Length counters are converted into the Quality Number.

The quality measure of the channel, as expressed in the Quality Number, can be used to tune any parameter in the system, the only limitation being that adding a parameter to be tuned adds to the set up time of the channel.

While an embodiment of a specific training function (700) has been presented in detail, it is understood that other training functions are within the intended scope of the invention, i.e. performing a real time analysis of the preprocessed data signal in order to find an optimal or near optimal set of parameters for adjusting the AFE for better performance in reducing ISI and other analog signal impairments.

Although the embodiment of the invention has been described in detail, it will be apparent to one skilled in the art that variations and modifications to the embodiment may be made within the scope of the following claims.

What is claimed is:

1. An analog differential deskew circuit for reducing a time skew, deskewing, of two polarities of a differential signal, comprising:
   a number of analog delay units arranged sequentially;
   a means for selecting a composite delay resulting from selected analog delay units;
   a means for inserting the composite delay into the polarities of the differential signal to reduce the time skew;
   a means for determining a quality of the differential signal after deskewing; and
   a means for controlling the means for selecting and the means for inserting in response to said quality.

2. The circuit of claim 1, wherein the means for inserting comprises a means for inserting the composite delay into one or the other polarity of the differential signal.

3. The circuit of claim 1, wherein each of the analog delay units has a gain which is substantially equal to 1.0.

4. The circuit of claim 1, wherein, each of the analog delay units comprises one or more amplifiers.

5. The circuit of claim 3, wherein each analog delay unit comprises:
   first and second amplifiers having a common input, which is the input of the analog delay unit, and their outputs being summed to generate the output of the analog delay unit;
   the first amplifier having a gain of (1.0-Δ), and a delay equal to a predetermined delay value; and
   the second amplifier having a gain of Δ, and substantially the same delay as the first amplifier.

6. The circuit of claim 5, wherein the first amplifier is a follower stage.

7. The circuit of claim 5, wherein the second amplifier has a shunt capacitor for setting the gain of Δ.

8. A method of deskewing a differential signal having two polarities, comprising the steps of:
   forming a variable analog delay comprising a number of analog delay units arranged sequentially;
   selecting a composite delay resulting from selected analog delay units;
   inserting the composite delay into the polarities of the differential signal to reduce the time skew;
   determining a quality of the differential signal after deskewing; and
   controlling the steps of selecting and the inserting in response to said quality.

9. The method of claim 8, wherein the step of inserting comprises inserting the composite delay into one or the other polarity of the differential signal.

10. An analog front end (AFE) circuitry for reducing distortion of a differential data signal, comprising:
    (a) an analog differential deskew circuit for adjusting a time skew of two polarities of the differential data signal, comprising:
       one or more analog delay units arranged sequentially;
       an analog selector, selecting a composite delay resulting from the delay units selected by the analog selector;
       analog switches, inserting the composite delay into the polarities of the differential signal; and
    (b) an equalizer circuit having at least two settings for adjusting a frequency response of the deskewed signal to produce an equalized signal.

11. The AFE of claim 10, wherein the analog switches are inserting the composite delay into one or the other polarity of the differential signal.

12. An analog front end (AFE) circuitry for reducing distortion of a differential data signal, comprising:
    (a) an analog differential deskew circuit for adjusting a time skew of two polarities of the differential data signal, comprising:
       one or more analog delay units arranged sequentially;
       an analog selector, selecting a composite delay resulting from the delay units selected by the analog selector;
       analog switches, inserting the composite delay into the polarities of the differential signal;
    (b) an equalizer circuit for adjusting a frequency response of the deskewed signal to produce an equalized signal; and
    (c) a phase compensator for aligning a phase of the equalized signal and a phase of a clock signal.

13. The AFE circuitry of claim 12, wherein the phase compensator comprises:
    an analog phase detector generating an analog delay control signal; and
    a programmable analog delay circuit in a path of the differential data signal for changing the phase of the equalized signal in response to the analog delay control signal.

14. The AFE circuitry of claim 13, wherein the analog phase detector comprises:
    a phase detector for comparing the phase of the equalized signal and the phase of the clock signal;
    a window generator for detecting positive edges of the equalized signal and generating an enable signal for the phase detector; and
    a circuit for converting an output of the phase detector into the analog delay control signal.

15. A system for reducing a time skew between two polarities of a differential signal representing a digital bit stream comprising:
    (a) a variable analog delay for inserting a variable time delay into polarities of the differential signal for generating a deskewed signal;
    (b) a multi-phase clock for generating a number M of clock phases per bit of the digital bit stream for oversampling the deskewed signal into a digital representation of the deskewed signal;
    (c) a logic circuit for estimating the quality of the digital representation of the deskewed signal;
    (d) a means for adjusting the variable analog delay in response to the estimated quality of the digital representation of the deskewed signal to improve said quality;
    (e) an equalizer circuit for adjusting a frequency response of the deskewed signal to produce an equalized signal;
    (f) an analog phase detector generating an analog delay control signal; and
    (g) a programmable analog delay circuit in a path of the differential signal for changing the phase of the equalized signal in response to the analog delay control signal.

16. The system of claim 15, wherein the variable analog delay comprises a variable analog delay for inserting a variable time delay into one or the other polarity of the differential signal.

17. The system of claim 16, wherein the variable analog delay comprises:
- a number of analog delay units arranged sequentially;
- a means for selecting a composite delay resulting from selected analog delay units; and
- a means for inserting the composite delay into one or the other polarity of the differential signal to reduce the time skew.

18. The system of claim 15, further comprising a phase compensator for aligning the phase of the equalized signal and a phase of a clock signal.

19. The system of claim 15, wherein M equals to one of the following:
- M=3;
- M=12;
- M=3 to 12.

20. A method for reducing a time skew between two polarities of a differential signal representing a digital bit stream, comprising the steps of:
- (a) generating a deskewed signal by inserting a variable analog delay into polarities of the differential signal;
- (b) generating a multi-phase clock signal having at least M phases per bit of the digital bit stream;
- (c) oversampling the deskewed signal with the multi-phase clock into a digital representation of the deskewed signal;
- (d) estimating the quality of the digital representation of the deskewed signal; and
- (e) adjusting the variable analog delay in response to the estimated quality of the digital representation of the deskewed signal to improve said quality;
- (f) adjusting a frequency response of the deskewed signal to produce an equalized signal;
- (g) generating an analog delay control signal; and
- (h) changing the phase of the equalized signal in response to the analog delay control signal.

21. The method of claim 20, wherein the step (a) comprises inserting a variable analog delay into one or the other polarity of the differential signal.

* * * * *